United States Patent [19]

Breuer et al.

[11] Patent Number: 4,672,307

[45] Date of Patent: Jun. 9, 1987

[54] SIMPLIFIED DELAY TESTING FOR LSI CIRCUIT FAULTS

[75] Inventors: Melvin A. Breuer, Encino, Calif.; Navnit K. Nanda, Jammu Tawi, India

[73] Assignee: University of Southern California, Los Angeles, Calif.

[21] Appl. No.: 811,349

[22] Filed: Dec. 20, 1985

[51] Int. Cl.⁴ ............................................. G01R 31/28
[52] U.S. Cl. ..................................... 324/73 R; 371/27
[58] Field of Search ........................ 324/73 R, 73 AT; 371/15, 16, 21, 23, 24, 25, 27

[56] References Cited

U.S. PATENT DOCUMENTS

| | | | |
|---|---|---|---|
| 3,919,637 | 11/1975 | Earp | 324/73 R |
| 3,988,670 | 10/1976 | Gariazzo | 324/73 R |
| 4,216,539 | 8/1980 | Raymond et al. | 324/73 R |
| 4,357,703 | 11/1982 | Van Brunt | 324/73 R |
| 4,435,806 | 3/1984 | Segers et al. | 371/25 |

FOREIGN PATENT DOCUMENTS 2316634  10/1974  Fed. Rep. of Germany ........ 324/73 AT

OTHER PUBLICATIONS

"Bit Pattern Generation Suitable for Use with Magnetic Bubble Testing", by Choy, IBM Tech. Dis. Bull., 4/78, vol. 20, #11B, pp. 4926-4927.
"AT LAST!" by Data Test Corp., Concord, CA, 4/1/71.

*Primary Examiner*—Reinhard J. Eisenzopf
*Assistant Examiner*—B. Burns
*Attorney, Agent, or Firm*—Poms, Smith, Lande & Rose

[57] ABSTRACT

Thorough delay testing of a combinational logic circuit is accomplished by changing only one input at a time (a single transition), and checking the output at a predetermined short time later, and arrangements are disclosed for systematically applying to the inputs of a combinational logic circuit all possible single transitions of the binary input signals. One economical test circuit uses a conventional binary counter and an associated ring counter to generate the test signals, in addition to input switching circuits or multiplexers for steering data to the logic to be tested and control circuitry to control the test process.

24 Claims, 29 Drawing Figures

```
→ 0 0 0      0 1 0        0 1 0
  1 0 0      0 1 1        1 1 0
  1 0 1      0 0 1        1 0 0
  0 0 1      0 0 0        1 1 0
  0 1 1      0 0 1        1 1 1
  1 1 1      1 0 1        1 0 1
  1 1 0      1 1 1        1 0 0
  0 1 0    → 0 1 1      → 0 0 0
→ 0 0 0
```

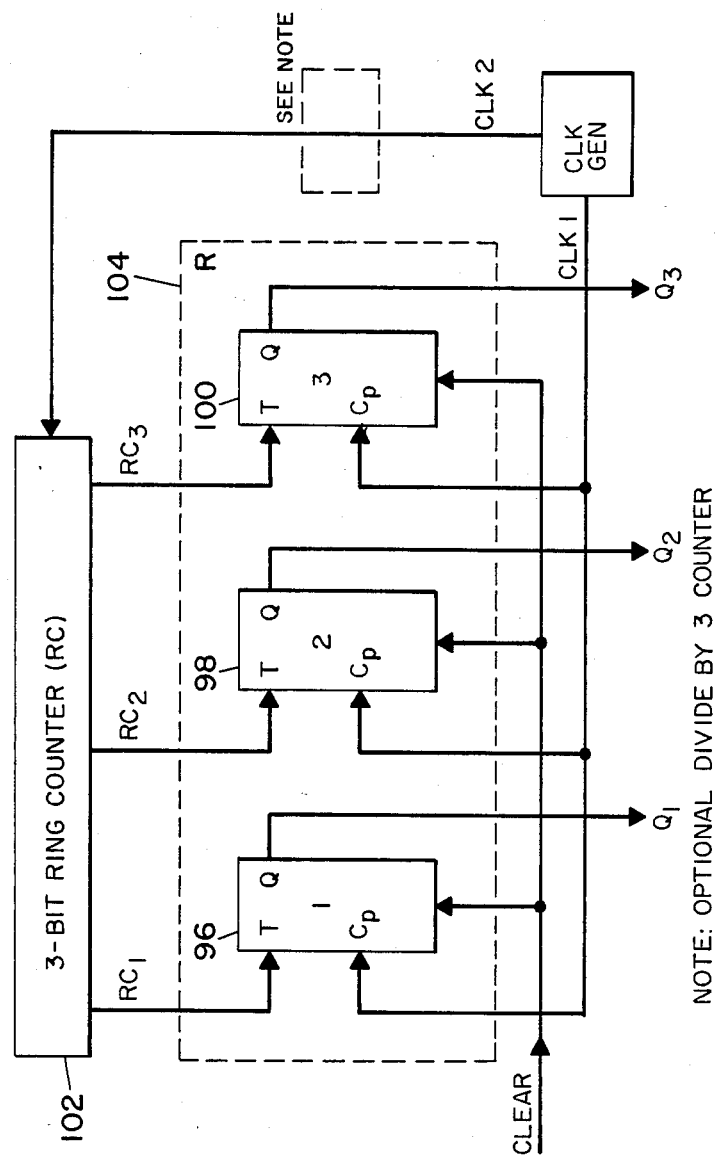

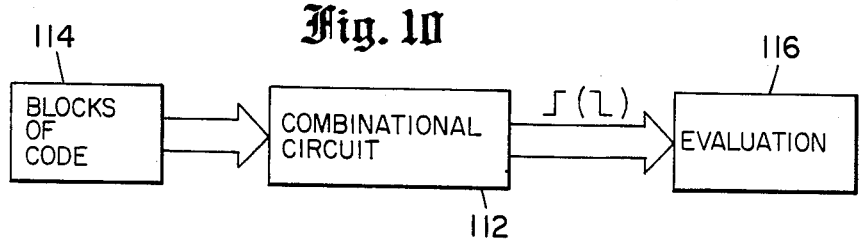
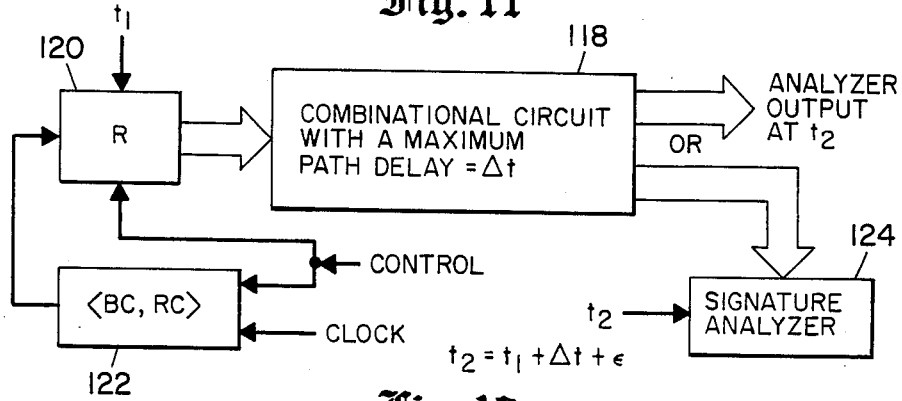
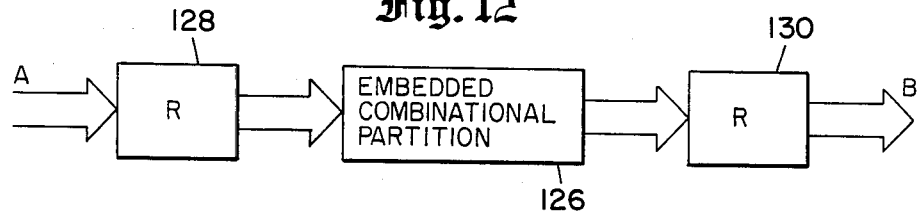
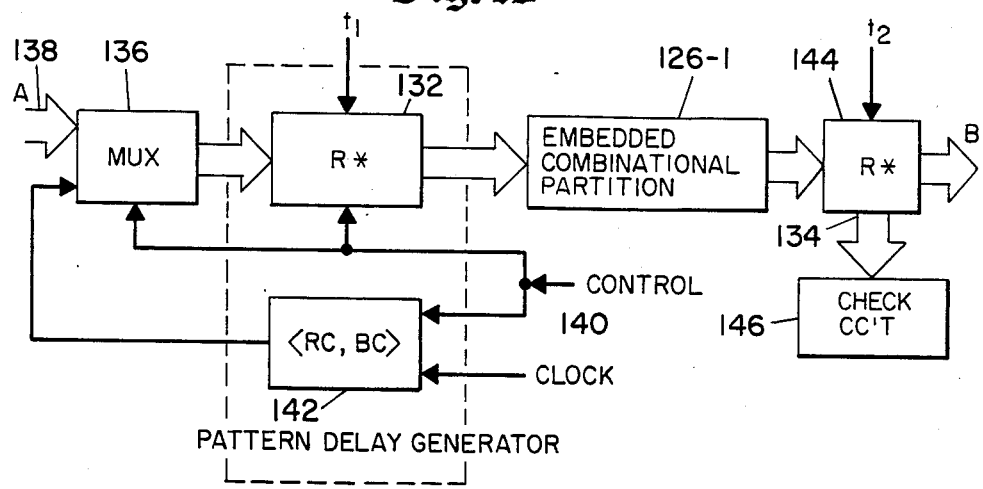

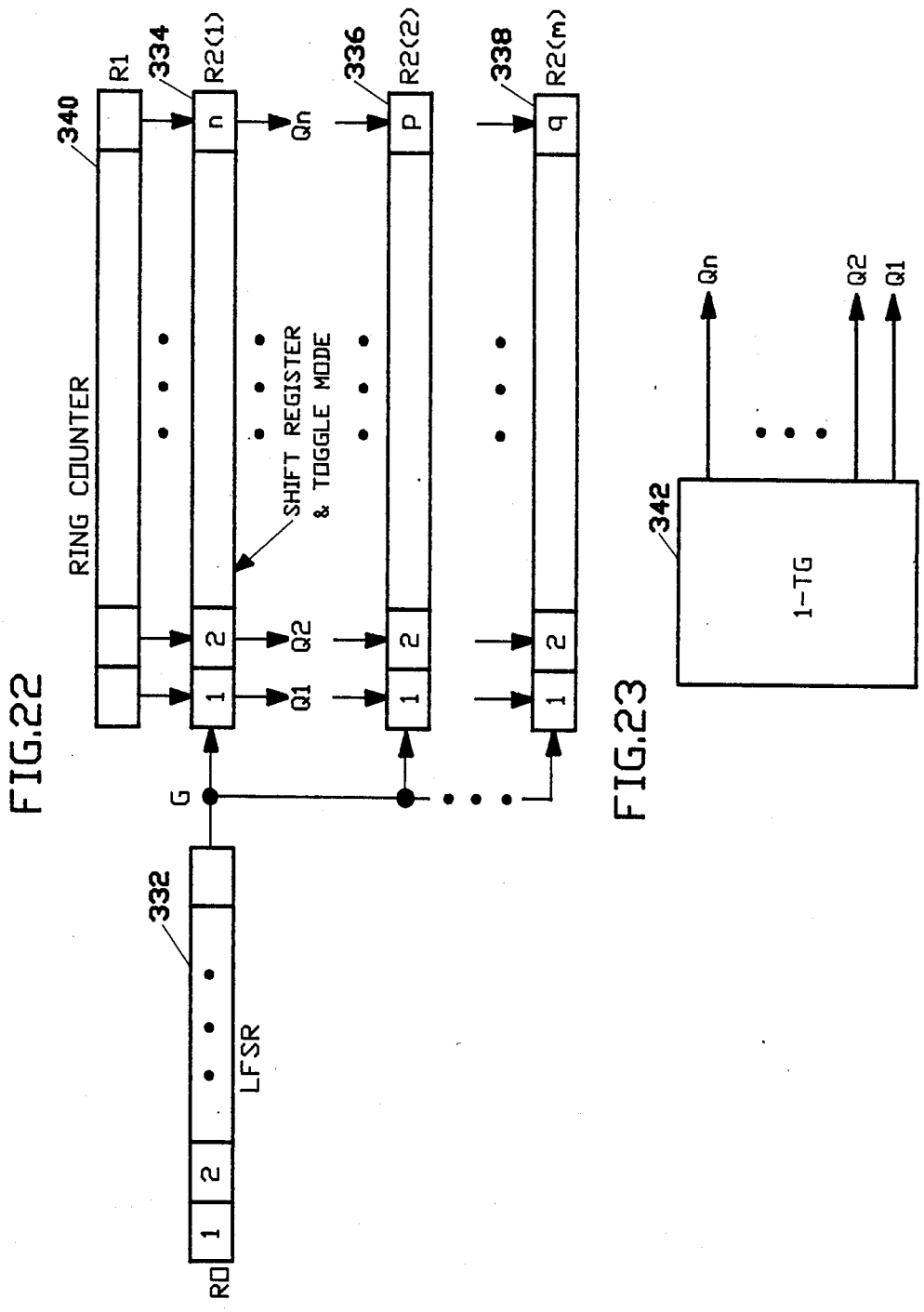

SIMPLIFIED DELAY TESTING FOR LSI CIRCUIT FAULTS

FIELD OF THE INVENTION

This invention relates to test systems for electronic logic circuits.

BACKGROUND OF THE INVENTION

Many arrangements have been proposed for testing combinational logic circuits, such as are included on circuit boards and chips, for permanent faults such as a grounded point or an open circuit. These permanent faults are often referred to as "stuck-at" faults.

However, even though a circuit board or a chip does not have any "stuck-at", or permanent faults, it may still not perform accurately when put in service. Thus a logic circuit might be expected to operate correctly during successive "clock" periods of operation of the data circuitry, which may be measured in millionths of a second (micro-seconds) or in billionths of a second (nanoseconds); and in fact, the switching time for the logic circuitry might take more than one clock period, so that a timely and correct output is not obtained. When a circuit response requires more time than specified by the design requirements, the circuit is said to contain a delay fault. Delay testing can be used to detect delay faults.

Some delay testing is often accomplished immediately following circuit fabrication, with special equipment available only at the manufacturing facility. However, delay faults often arise at later points in time, and effective detection of such faults has presented a significant problem, particularly as the complexity and density of digital logic circuits has increased.

The motivation behind delay testing is to ensure that the circuit will run at a pre-established rate. Usually no attempt is made to check for the delay faults in the LSI circuit once it has been put into functional operation, and whatever maintenance tests or self-tests that are provided usually deal only with "stuck-at" faults With the adoption of VLSI and increasing integration densities, there is a reasonable probability that delay faults may arise in a circuit during the operational phase. This may well be due to physical changes, such as metal migration, which in turn may result in the variation of current and voltage distributions within the circuit, thereby affecting its dynamic behavior by causing the logic to switch at slower speeds as compared to the specified normal values. These delay faults may well be the first phase of circuit degradation, and are often invisible to the maintenance self tests. They often appear to a maintenance engineer as intermittent faults and are extremely difficult to diagnose.

FUNDAMENTAL BACKGROUND DISCUSSION

Now, before going into the background of the invention to the next level of depth, it is useful to define certain terms. First, we are dealing primarily with combinational logic circuits having several inputs, and we will designate the number of inputs by the letter "n". So if a logic circuit has three binary inputs, "n" would be equal to 3, and each of the three binary inputs could have either of two values, and these two values are normally represented by either a "1" or a "0". Accordingly, one typical input to our three input logic circuit could be 101, indicating that two of the inputs have one state represented by a binary "1", and the third has the other possible binary state, represented by "0".

The number of possible input states a combinational input circuit having n inputs is equal to 2 raised to the nth power. Thus, for a two input combinational circuit, the number of possible input combinations is $2^2$ or 4. These four input combinations are as follows: 00, 01, 10, and 11. Similarly, a three input logic circuit can have $2^3$ or 8 input combinations.

In order to provide delay testing for combinational logic circuits, one must change the inputs, and check the output to determine whether the output change occurs in a timely manner. Changes in the inputs are referred to as "transitions". If you change only one input, this is referred to as a "1-transition". Changes of more than one input, or digit, are referred to as multiple transitions, or as "i-transitions", where the letter "i" represents the number of transitions.

A set of binary numbers where there is only one transition between successive numbers is known as a "Gray" Code, after Frank Gray, a former employee of the Bell Telephone Laboratories. Gray codes, or 1-transition codes find utility in many areas, one of which will be developed hereinbelow. A two digit Gray code would be as follows: 00, 01, 11, 10. On the other hand a multiple transition such as from 00 to 11, which involves two transitions, would not be included in a Gray code.

In the analysis of binary codes the phrase "Hamming distance" is also a useful concept. Mr. Hamming was also a Bell Telephone Laboratories employee, and did some early work in error correcting codes. Two binary numbers which only differ from one-another in a single digit place, such as adjacent Gray code numbers are said to have a Hamming distance of 1. The transition from 00 to 01 has a Hamming distance of one; while the transitions from 00 to 11, and from 101 to 110 both have a Hamming distance of two.

Now, returning to a discussion of delay testing, two approaches have been used heretofore in dealing with the generation of test patterns for delay faults, as follows:

1. A 1-transition is applied which simultaneously sensitizes a path primary input to a primary output, and in addition propagates a transition along the logic gates of the selected path. This situation defines what is referred to as a complete Transition Path and the vector pair generating the 1-transition at the input, constitutes a Path Delay Test.

2. Multiple, or i-transitions may be applied, where i is greater than 1 and more than one transition path starting from different inputs terminate at different outputs without masking each other.

In the first approach, a 1-transition pair is generated on an input line of a combinational circuit and the remaining lines are constrained to provide for the enabling conditions to ensure propagation of the 1-transition from a primary input to a primary output. A required set of such 1-transition pairs is generated for all the primary inputs so that every gate/interconnection wire of the circuit is covered at least once. During some physical testing and post calculations, the maximum delay of the circuit is calculated from the set of measured delays of individual signals at the outputs due to 1-transition inputs. This approach has the following disadvantages:

(i) The technique being path oriented, the generation of patterns is very much tied to a specific combinational circuit.

(ii) Requires construction of path graphs and path matrices, determination of linearly independent paths, etc. for selecting paths across which the delay measurements are to be made.

(iii) Considerable forward path tracking and backtracing is required and decisions need be made at every gate to assign values for setting up the complete transition path between the selected primary input and output, resulting in expensive computational effort.

(iv) For the purpose of applying these patterns for delay fault testing, the test vectors either have to be loaded into the VLSI chip for each partitioned combinational net via an automatic test equipment (ATE), or alternatively stored in internal Read Only Memory (ROM) and then applied sequentially. The former leads to a time consuming process (more so if the data input is serial), whereas the latter requires enormous chip area.

In the second approach dealing with multiple or i-transitions, a stuck-at fault test-vector set is considered as the basis, and this set is enhanced to provide for delay fault testing by allowing more than one transitions to occur simultaneously at the inputs of the circuit, thereby testing more than one path at a time for delay faults. This approach is significant in that it combines the testing of delay faults along with "stuck-at" faults. However, though resulting in a smaller set of vectors, the approach does depend upon the topology of the combinational circuit under test. Furthermore, care has to be taken that the sensitive paths due to different transitions do not mask each other. Except for the fewer number of vectors generated due to multiple transitions, this approach in general suffers from most of the disadvantages as elucidated earlier for the 1-transition case, more specifically the points i and iv. In addition the modified test-vector set may not cover all the delay faults, thereby necessitating test-generation for the uncovered delay faults by some other known technique.

SUMMARY OF THE INVENTION

In accordance with the present invention a generalized approach for the delay testing of combinational logic circuits has been developed. This approach involves, in an important way, the recognition that the systematic application of all possible 1-transitions to the input of a combinational circuit is equivalent for most purposes to the application of all multiple transitions to the circuit.

Accordingly, as an important feature of the invention, testing circuitry is provided which applies all possible 1-transitions to a several input combinational logic circuit and checks for the accuracy of the output of the logic circuit, either by "signature analysis", comparison with a known correct circuit, or in other ways, known per se.

In accordance with another aspect of the invention, it has been determined that an appropriate Gray code series of all 1-transition binary inputs may be generated using the combination of a ring counter and a conventional counter, coupled by a switching circuit such as a multiplexer, to the input of the logic circuit to be tested. The input switching circuit or multiplexer permits quick and convenient switching between normal data processing operation and the testing mode.

Advantageously, registers may be provided at the input to the combinational circuit at least during the test mode so that timed transitions from one input combination to the next may be accomplished in a controlled manner.

In accordance with optional arrangements, to test for malfunction under electrical saturation conditions, for example, the circuitry may be operated under test for several clock periods, with a single applied pattern, followed by the usual 1-transition, and the output checked after a single clock period or other shorter interval, for example.

In accordance with another aspect of the invention, selected 1-transitions or a complete set of all 1-transitions may be applied to a combinational logic circuit under test by a test circuit including a set of input registers, and a ring counter for changing the state of individual registers in said set of registers, in accordance with the successive states of said ring counter.

Another feature of the invention is the accomplishment of virtually complete combinational logic testing using only about $n2^n + 1$ transitions, where n is the number of inputs to the circuit.

Advantages of the new testing system include the generalized applicability to the delay testing of any type of combinational logic circuit, and the ease of building the circuitry into LSI or VLSI chips as self testing features.

Other objects, features and advantages will become apparent from a consideration of the following detailed description, and from the accompanying drawings.

BRIEF DESCRIPTION OF THE DRAWINGS

FIG. 7a is a "Eulerian" graph or diagram showing all possible 1-transitions of the inputs of a three input combinational logic circuit;

FIG. 7b is a table showing the 1-transitions between successive states as diagrammed in FIG. 7a;

FIG. 9 shows the use of a ring counter to generate one transition, or Gray code patterns;

FIGS. 10 through 13 are block diagrams showing arrangements for implementing delay test circuitry;

FIG. 16 is a timing diagram for one block of code and one state initialization of the circuit of FIGS. 14 and 15;

FIG. 22 shows circuitry for the generation of 1-transitions using a linear feedback shift register, a ring counter, and conventional shift registers;

FIG. 23 shows the symbol for a 1-transition generator;

DETAILED DESCRIPTION

Figure 1:
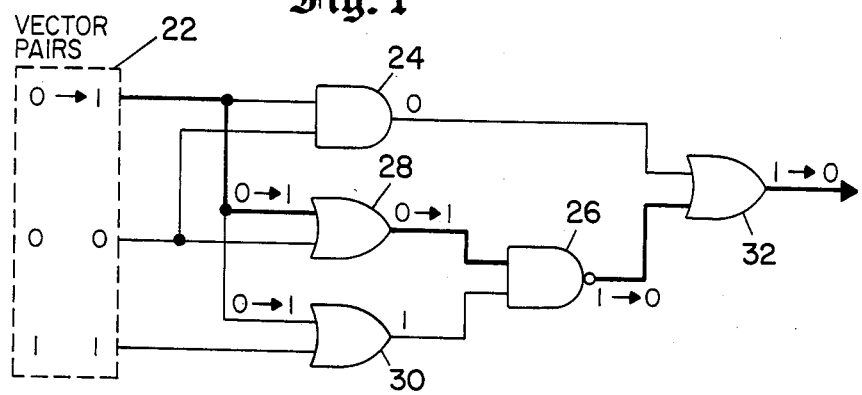
FIG. 1 is a logic diagram of a simple combinational circuit showing a 1-transition input.

Referring more particularly to the drawings, FIG. 1 shows a simple combinational logic circuit involving a 1-transition, i.e., a change in the input codes applied from block 22 by only changing one of the three inputs, the upper input shown in FIG. 1. The changes which arise as a result of this one transition are also diagrammed throughout the circuitry. Incidentally, for completeness, it is noted that "AND" gates are represented by a symbol such as that shown at 24 in FIG. 1. With regard to the output of "AND" gates, they have a "1" output when, and only when both of the two inputs to the AND gate have "1" states. OR gates are shown by symbols such as those indicated at 28, 30 and 32 in FIG. 1, and they provide a "1" state output if either or both inputs re in the "1" state. The circuit 26 in FIG. 1 is a "NAND" gate, and is made up of an AND gate together with an inverter, as indicated by the small circle at the output of the AND gate. A NAND gate has a "0" output state only when each input is a "1"; otherwise the output is a "1".

Figure 2:
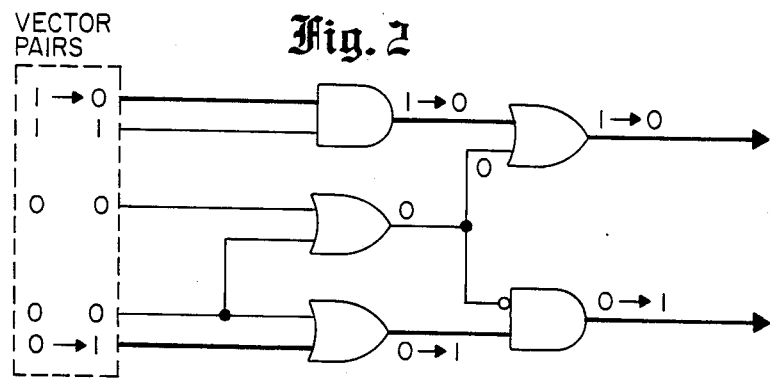
FIG. 2 is a similar circuit showing a two-transition input.
Figure 3A:
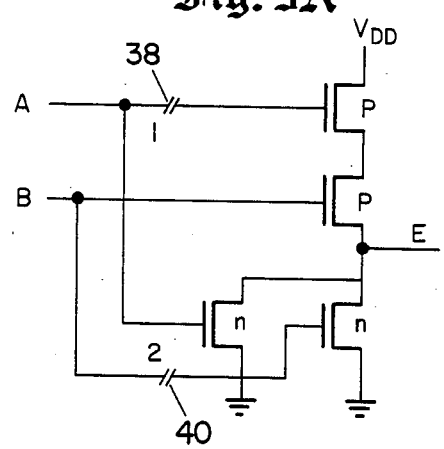
FIGS. 3A and 3B are circuit diagrams of a "NOR" gate employed for the discussion of possible types of faults which may arise in semiconductor logic circuits.
Figure 3B:
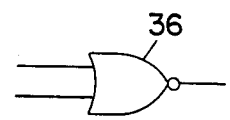
Figure 4:
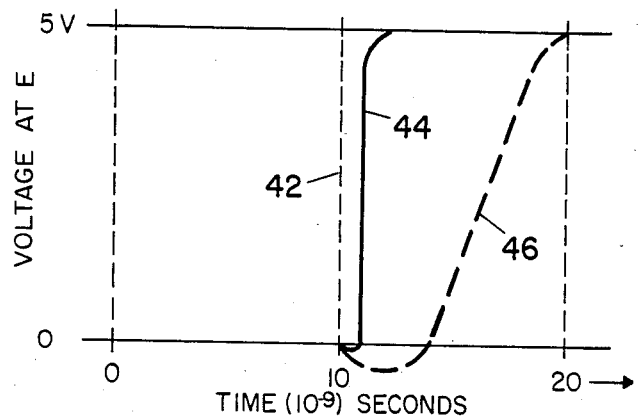
FIG. 4 is a timing diagram illustrating a delay fault.

FIG. 2 shows a similar simple combinational logic circuit but one in which there are five inputs, and a 2-transition input shift is shown. In addition, the transitions which occur as this 2-transition shift is made are shown in FIG. 2. FIGS. 1 and 2 are included primarily for background information and to provide a basis for a subsequent discussion and use of terminology. FIG. 3 shows a CMOS NOR gate, with FIG. 3A showing the circuitry as implemented with field effect transistors, and FIG. 3B showing the logic symbol 36 for a NOR gate. A NOR gate provides a "1" output only when both inputs are in the "0" state; otherwise the output is a "1". In FIG. 3, two possible faults, 38 and 40 are indicated, showing that certain leads are open. FIG. 4 is a timing diagram indicating a transition which occurred at 10 nanoseconds, as indicated by the vertical dashed line 42, with the output transition normally occuring as indicated by the solid line 44 within a nanosecond. However, with a delay fault as indicated by the dashed line 46 the transition may take considerably longer such as 10 nanoseconds, with the delay having arisen from an one of a number of factors such as misalignment of masks employed in the formation of a chip, high resistance, and so forth.

The present invention involves the detection of delay faults of the type shown in FIG. 4, as well as the more easily detected so-called "stuck-at" faults arising from open circuits or short circuits.

Figure 5:
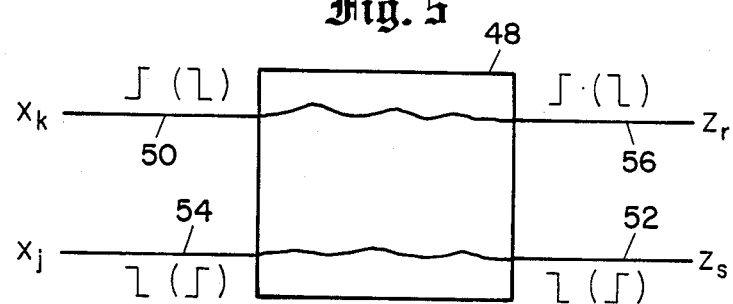
FIG. 5. is a schematic block diagram of a combinational circuit wherein there are independent transition paths.
Figure 6:
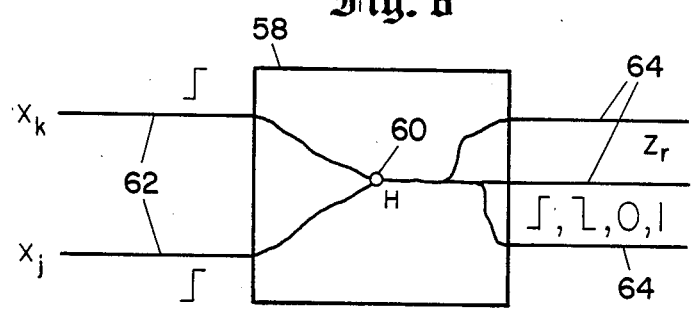
FIG. 6 is a diagram similar to that of FIG. 5 but wherein there are converging transition paths.

FIGS. 5 and 6 will now be considered and employed to develop an important concept which was instrumental in leading to the circuits as set forth below, and which illustrate the principles of the present invention. More particularly, through a discussion of FIGS. 5 and 6 involving independent and converging transition paths, respectively, it will be shown that for virtually all types of faults, a series of all possible 1-transitions is virtually as effective as utilizing all possible multiple transitions, in the identification of delay faults.

In the following logical development, it will be shown that when a multiple transition occurs, the number of delay faults detected is less than or equal to the delay faults detected by a set of equivalent 1-transitions. For the sake of explanation, we will first consider the 2-transition case and then generalize the results for multiple transitions when the number of transitions is greater than two.

When a 2-transition vector pair is applied, as in the case of FIGS. 5 and 6, several different cases exist. Thus, for example, in FIG. 5 the case of independent transition paths through the combinational logic circuit 48 is present. Thus, input 50 has no effect on output 52, and similarly, input 54 has no effect on output 56. In the case of FIG. 6, however, the combinational circuit 58 includes a node 60, also designated by the letter "H" whereby the inputs 62 affect the outputs 64, and accordingly, the outputs 64 are not independent of either of the two inputs 62. It is also assumed that logic circuits 48 and 58 have additional inputs (making a total number of inputs equal to "n") which are not changed at this time, and may have additional outputs.

Considering now FIG. 5, $X_k$ and $X_j$ are the two inputs which change due to a 2-transition pair. Assume that the remaining (n−2) inputs have logic values such that two transition paths independent of each other are created as shown in FIG. 5. Consider the path from $X_k$ to $Z_r$. This path exists for logical values either 0 or 1 on $X_j$. Similarly, the path from $X_j$ to $Z_s$ is independent of the value on $X_k$. In fact this means that the sensitization conditions for the two paths is independent of variables $X_j$ and $X_k$. Therefore, the paths sensitized by a 2-transition test pair can be sensitized using two 1-transition test pairs (applied at different times), one for $X_k$ and one for $X_j$ and thus detect the same number of delay faults.

Now, considering FIG. 6, let H be any intermediate node in the circuit structure. When a 2-transition pair is applied, the signal transitions arriving from $X_k$ and $X_j$ at H are either identical or complementary. Assuming H is a normal vertex function, such as an AND or an OR gate, then if the transitions are identical, a transition path may exist from H to one or more outputs. Hence, two complete transition paths $X_k$-H-$Z_r$ and $X_j$-H-$Z_r$ exist. Therefore, for the transition path $X_k$-H-$Z_r$($X_j$-H-$Z_r$), the input $X_j$($X_k$) is providing the logical value 0 or 1 which provides the enabling conditions at the converging node H. Hence, these paths can in any case be sensitized independently using only 1-transition pairs.

When the signal transitions from $X_k$ and $X_j$ at H are complementary, no further propagation from H exists. (In this analysis we are ignoring hazards). Hence, the paths $X_k$-H-$Z_r$ and $X_j$-H-$Z_r$ cannot be tested for delay faults. These paths, however, may possibly be tested with two 1-transition pairs affecting inputs $X_k$ and $X_j$, i.e., path $X_k$-H-$Z_r$($X_j$-H-$Z_r$) may be sensitized corresponding to one of the logic values 0 or 1 at $X_j(X_k)$ that provide the necessary enabling condit at H.

In fact, it can be argued that whenever a second transition is initiated (presuming that a 1-transition is already present) to realize a 2-transition input pair, it does not provide detection of any additional delay faults that cannot be tested through two 1-transition inputs exercised independently. The initiation of the second transition will either change the enabling conditions (0 for an OR gate and 1 for an AND gate) so as to block the propagation of signals due to the first transition, or else the values remain unchanged.

Therefore, when 2-transition signals are applied at the inputs of a circuit no additional paths are tested for delay faults which could not be tested by 1-transition test pairs. In fact, due to complementary converging effects, increasing the number of simultaneous input transitions may lead to a reduction in the number of complete transition paths. With the number of input transitions greater than 2, the probability of reduction of complete transition paths increases depending upon the topology of the circuit, but there is no additional path or sub-path that is covered by multiple transitions which is not taken care of by a set of not more than $2n \times 2^n$ 1-transitions.

Hence, it is sufficient only to apply 1-transition inputs for detecting most delay faults.

Now that we have established that virtually complete testing may be accomplished by applying a set of all possible 1-transition, it is useful to again consider a specific example as well as the generalized number of transitions which will be required for a combinational circuit having a number of inputs equal to n. We will initially consider FIGS. 7A and 7B, where FIG. 7A is an Eulerian type diagram, relating to a three input combinational circuit showing all possible 1-transitions; and FIG. 7B is a listing of the successive input codes resulting from one particular set of transitions.

Figures 7A, 7B:
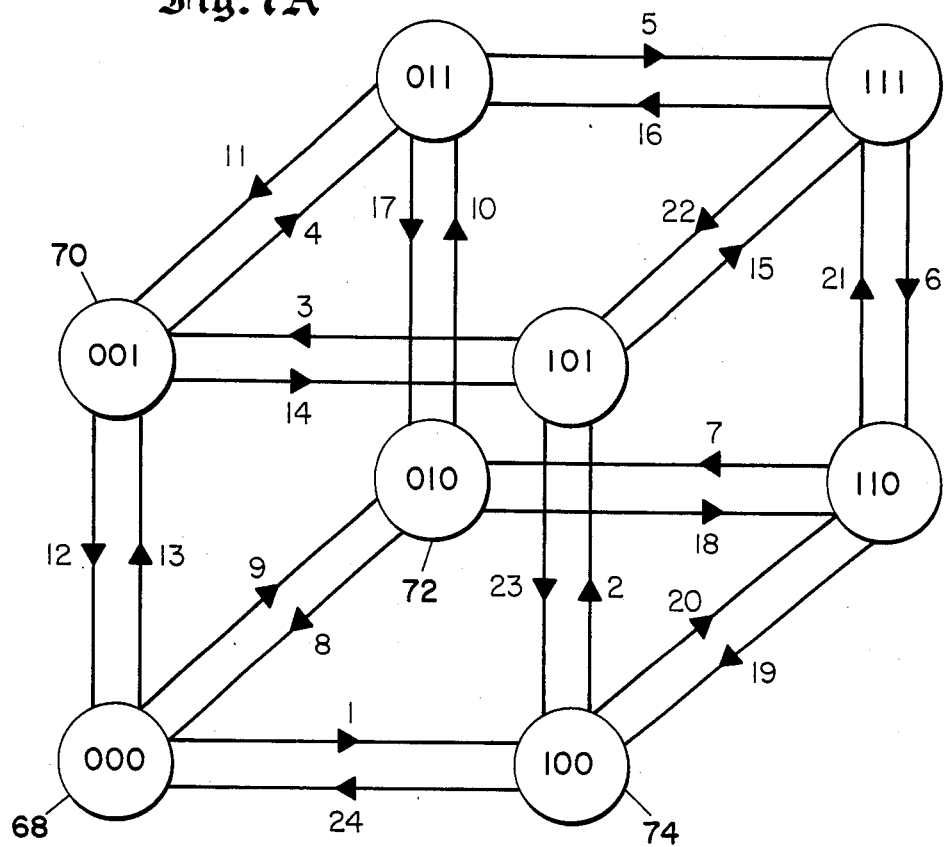

Initially, to go back to basics, the number of inputs, "n" to the combinational circuitry represented by FIG. 7A is 3. These inputs may take either of two states, represented by a 0 or a 1, and these two states may, for example, be as shown in FIG. 4, either 0 or ground voltage or plus 5 volts. With each of the three inputs being capable of being either in the "0" or in the "1" state, the total number of input combinations as shown in FIG. 7A by the corners of the cubic representation, is 8. his is equal to $2^3$. On a more general basis, the number of possible input combinations to a n-input combinational logic circuit is $2^n$. The next question is: "how many possible 1-transitions are there, for a 3-input combinational logic circuit?" This analysis may be simplified by looking at the diagram of FIG. 7A. We have noted that there are 8 different input combinations, and it may further be noted that for each one of these input combinations there are three adjacent combinations which differ from the first selected combination by only one digit or one input being changed. Thus, more specifically, note the input combination 000 which is in the lower left corner circle 68 of the cube represented in FIG. 7A. Note further that there are only three other immediately adjacent combinations 70, 72 and 74 which differ from the original input combination 000 only a change of one digit. Thus, we see that a three-input combinational logic circuit, there are three 1-transition adjacent combinations. Multiplying the number of input combinations $2^n$ times the number of adjacent 1-transitions, which is equal to n, makes a total of $n2^n$ 1-transitions. For a three-input combinational logic circuit, wherein n equals 3, this means that there are 24 1-transitions. In FIG. 7A, there are two arrows interconnecting each node, with these arrows pointing in opposite directions, and each of these arrows has a number immediately adjacent to it indicating a series of 1-transitions which may be taken to cover all possible 1-transitions between all of the nodes. Further, it may be observed, that this series of states is 24 in all, and that there are 25 successive transitions, or $n2^n + 1$. Thus, we have experimentally verified the mathematical concept. FIG. 7B in three columns shows the complete vector sequence for the Eulerian path shown in FIG. 7A by the numbered steps, with this being only one of several possible sequences.

In the foregoing description, we have shown that an effective test arrangement would involve the application of all possible 1-transitions to the inputs of a combinational logic circuit. We have also shown that the minimum number of 1-transitions for a combinational logic circuit having n inputs is $n \times 2^n$, and we have verified these numbers for a 3-input combinational circuit. In this regard, with n equal to 3, for a three-input combinational circuit, the number of possible input combinations is equal to $2^n$ or 8, and the number of transitions is $n \times 2^n + 1$, or 25, with the 24 states and 25 transitions shown enumerated in FIG. 7B.

The next step is to determine how a sequence of all possible 1-transitions may be easily generated and applied to the combinational logic circuit.

Figure 8:
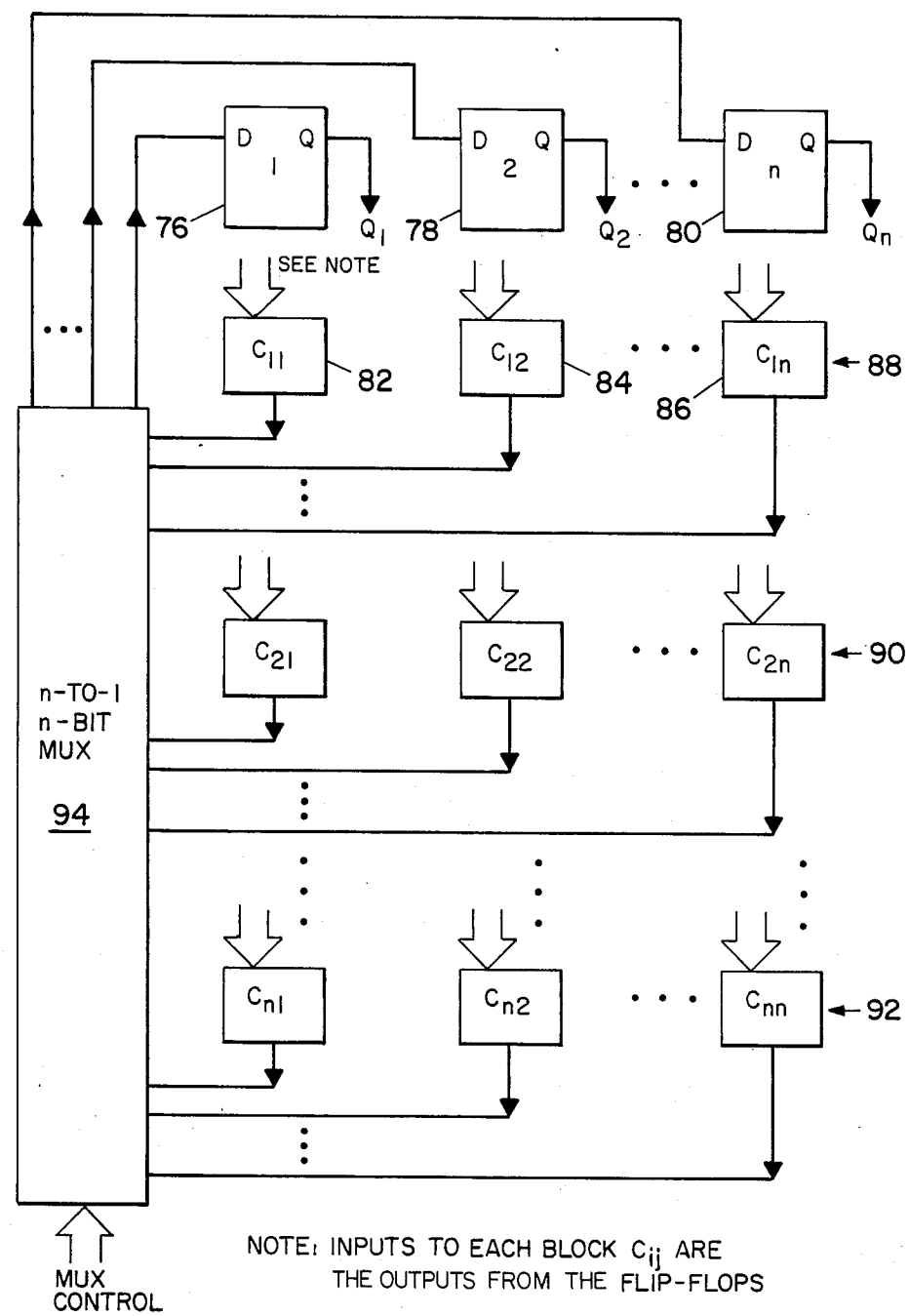
FIG. 8 is a diagram of a "Brute Force" implementation of the diagram of FIG. 7.

FIG. 8 shows a "brute force" implementation of a circuit for providing any possible desired sequence of inputs (including all 1-transitions) to the combinational logic circuit. More specifically, the flip-flops 76, 78 and 80 provide the inputs to the combinational logic circuit. These flip-flops could be initially cleared, and then a set of combinational logic circuits such as the "n" circuits 82, 84 and 86 could be provided, with these combinational input circuits having as inputs all of the outputs from the flip-flops 76, 78 and 80; and these combinational logic circuits could generate any desired output binary signals, and with a number of combinational logic circuits 82, 84 and 86 equal to the number n of flip-flops 76, 78 and 80 providing input digits, a complete new sequence of $2^n$ transitions may be provided during successive time intervals. With a large number of sets of combinational logic circuits, all of which are energized from the flip-flops 76, 78 and 80, and each set of which is successively enabled, a sequence of $2^n$ 1-transitions is formed. If the number of rows 88, 90 92, etc. is n, these n rows of logic circuits will produce $n2^n$ 1-transitions. With the multiplexer 94 successively applying the outputs from each of the combinational logic circuits 88, 90, 92 to the inputs to the flip-flops 76, 78, and 80, their outputs may be arbitrarily changed during successive clock or cycle intervals as the circuit designer may desire. However, a vast number of combinational logic circuits in the sets 88, 90 and 92 are required, and accordingly, the theoretically possible circuit of FIG. 8 for implementing all possible 1-transitions, is considered to be quite impractical. However, using this approach, a design of a circuit to realize the 3-bit code of FIG. 7B was carried out; this resulted in a combinational logic network of 22 gates, 3 flip-flops and a 3-bit three-to-one multiplexer.

With regard to FIG. 8 of the drawings, a "brute force" method for obtaining all 1-transitions was disclosed. In connection with FIGS. 9 through 17, much more efficient test circuitry will be disclosed. It is further noted that in connection with FIGS. 18 through 27 of the drawings an efficient design which introduces minimum delay is disclosed.

Consideration will now be given to more economical circuitry for implementing all possible 1-transitions for a combinational logic circuit having any number of inputs. As one component to be included in such a circuit, the arrangement of FIG. 9 is of considerable interest. FIG. 9 includes a three bit register including three trigger flip-flops 96, 98 and 100, and a three-bit ring counter 102. We initialize the ring counter to the state "100". A ring counter is a circuit made up of a set of bistable electronic components connected in a ring, with only one of the components in a predetermined "1" state, for example. As the ring counter is pulsed, the ring counter is advanced, the component in the "1" state is switched to the "0" state, and the next component is switched to the "1" state, and so forth.

Returning to FIG. 9, with the flip-flops in their trigger mode, each clock time, the single logic 1 value in the ring counter will change only one-bit in the three-bit register 104, leaving the other flip-flops unchanged. This enables the generation of Gray coded patterns, with only 1-transition during each successive clock period. Letting the ring counter 102 go through two complete circular shifts, i.e., each bit of the ring counter assuming the logical value "1" twice, the ring counter outputs for two complete circular shifts will be 100, 010, 001, 100, 010, and 001. Starting with different initial states such as 000, 001, 010 and 011 in the register 104, and applying the above ring counter sequence, the blocks of Gray code sequences will form a complete set of 1-transitions required for the testing as outlined hereinabove. Table I set forth hereinbelow shows the patterns generated.

When the foregoing sequences are applied to a combinational circuit, and the outputs from the combinational logic circuits under test are analyzed for correctness following a predetermined period of time such as one clock period after the occurrence of the transition, a full check of the combinational logic circuit will have been accomplished. The output may be checked by signature analysis techniques, or by comparison with a known perfect board, or by other known techniques.

FIG. 10 is a block diagram indicating one implementation of the principles of the present invention. More specifically, a combinational circuit 112 to be tested has blocks of code applied to it from an input source 114, which provides all possible 1-transitions to the combinational circuit 112. An evaluation circuit of the signature analysis or other types as mentioned above, designated 116, is coupled to the output from the combinational circuit 112 and determines whether any delay faults or "stuck at" faults are present in the circuit 112.

FIG. 11 is a somewhat more detailed block diagram showing one preferred system illustrating the principles of the present invention, in which a combinational circuit 118 is being analyzed, and it is postulated that the maximum path delay of the combinational circuit 118 shall be equal to or less than Delta "t". In this case, Delta "t" may be equal to the clock period for successive operations of the data processing circuit. Input register 120 may be provided with successive digital inputs to the combinational circuit 118 from a special digital timing and control circuit 122 which may include both a binary counter and a ring counter intercoupled as discussed hereinabove, and indicated by the letters "BC" and "RC". A binary counter is a well known logic circuit having several intercoupled bistable stages, which assume outputs corresponding to successive binary numbers as the counter circuit is pulsed, or advanced.

At the output from the combinational circuit 118, the signals may be analyzed continuously or in successive clock periods following the occurrence at time $t_1$, of a transition within the register 120 having parallel outputs applied to the combinational circuit 118. In this case, the time $t_2$ would be the next subsequent clock period, or some time slightly greater than Delta "t" after $t_1$. Alternatively, a signature analyzer 124 may be employed, and this may be sampled at some point in time following the complete run-through of all 1-transitions, by examining the output of the signature analyzer register and confirming that it matches a predetermined pattern.

FIG. 12 shows a combinational logic circuit 126 located between two registers 128 and 130. Such configurations frequently occur in digital logic circuits. FIG. 13 indicates one way this type of circuit can be modified so that it can be tested for delay faults.

FIG. 13 is a simplified block diagram of a circuit which may be built into the chip to test the circuit 126-1, which may, for example, be located between two sets of registers 132 and 144. Registers 132 and 144 in FIG. 13 are modified versions of the registers 128 and 130, respectively, of FIG. 12. A multiplexer or switching circuit 136 is provided to permit normal operation of the embedded combinational circuit 126-1 with normal input signals arriving from the inputs 138, or a self-test mode, where the states of the register 132 are controlled by the control lines 140, including the outputs from the ring counter and binary counter included within block 142, which are supplied to control the state of the register 132 while connected to register 132 by the multiplexer 136. The output registers 144 may be operated in a shift register mode including signature analysis techniques, and a check circuit 146 may be coupled by bus 134 to register 144 to verify that the output from the embedded combinational circuit 126-1 is correct in the next subsequent digit periods. The check circuit 146 may be in the form of a signature analysis circuit, or it may be a matching circuit for comparing the output of circuit 126-1 with known perfect chips.

Figure 14:
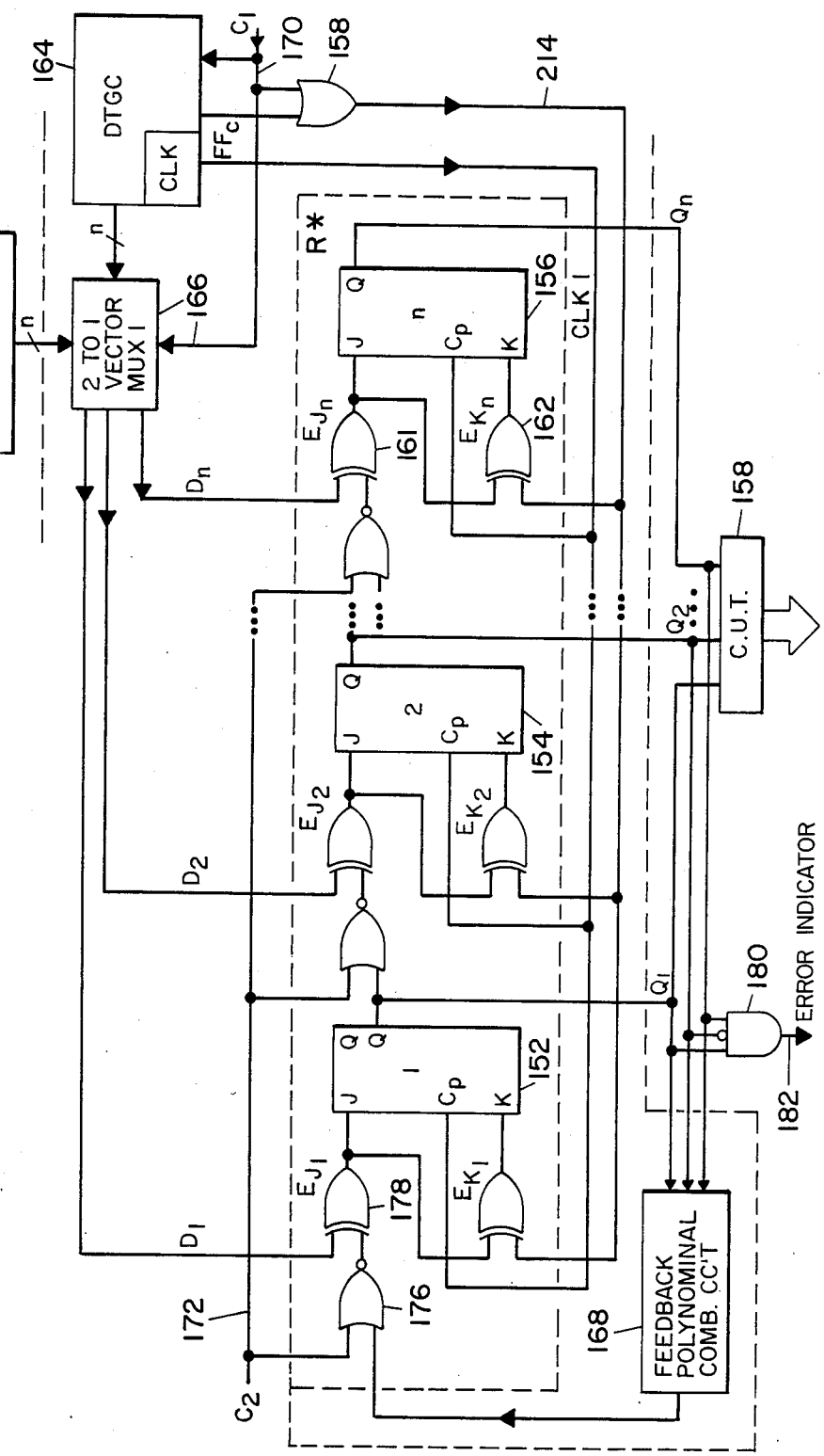
FIG. 14 is a circuit diagram indicating the hardware organization of a typical circuit employed in the implementation of the present invention.

FIG. 14 is a detailed logic circuit diagram showing one possible arrangement of flip-flops 152, 154 and 156 for implementing a register R* which may be located between successive combinational logic circuits being tested. Incidentally, in FIG. 14, the combinational logic circuit under test (designated C.U.T.) bears the reference numeral 158, and the previous combinational circuit appearing at the top in FIG. 14 is identified by reference numeral 160.

We will now consider the mode of operation of the logic circuit of FIG. 14 in somewhat greater detail. Initially, it may be noted that the J-K flip-flops 152, 154 and 156 normally have two output states, which may be represented by the usual binary "1" and binary "0". Depending on the inputs applied to the J and K inputs of each flip-flop, it may either hold its existing state when a clock pulse is applied to it, if both inputs are "0"; it may toggle or switch to its opposite output state both the J and the K inputs are "1", when a clock pulse arrives; it may be set to the "1" state if the J input is "1" and the K input is "0"; and finally, if the J input is "0" and the K input is "1", the flip-flop is reset to the "0"

state, with the action occurring in each case when a clock pulse arrives. Also to be noted in the circuit of Fig. 14 are the OR circuits such as that shown at reference numeral 158, which provides a binary "1" at its output when either or both of the two inputs is energized with a binary "1"; and the exclusive OR circuits, such as circuits 161 and 162 at the input to the flip-flop 156, which provide a binary "1" output when either but not both of the two inputs are energized with a binary "1".

Also to be noted in FIG. 14 are the digital test generation circuitry 164; the multiplexer or MUX 166 which switches the input to the register R* between the normal input from combinational circuit 160 and the special test input from circuit 164; and the feedback circuit 168 which comes into play when the register R* is operated as a shift register in the signature analysis mode, usually referred to as a linear feedback shift register.

Now, the mode of operation of the circuit of FIG. 14 is controlled by signals applied on the control leads C1, also designated by the reference numeral 170, and C2, also designated by the reference numeral 172. When both C1 and C2 are in the "1" state, then the circuit operates in its normal data processing mode, with information from the combinational circuit 160 passing through the multiplexer 166 to the registers 152, 154 and 156 making up the R* register. From the R* register, output information is supplied to the combinational logic circuit 158.

When C1 is "0" and C2 is equal to binary "1", the digital test generation circuitry 164 is connected to supply digital information to the registers 152, 154 and 156, and a test pattern is applied to the combinational logic circuit 158 under test. More specifically, and as set forth in detail below, register R* is initially cleared, then a number from the binary counter within circuit 164 is supplied to register R*, with the flip-flops being accordingly set, and then the ring counter pattern is applied from the circuit 164 through the multiplexer 166 to the flip-flops to generate the desired transitional test pattern. After two cycles of operation of the ring counter, a new binary number is entered and the sequence is repeated, all as will be set forth in greater detail below.

When the control pattern includes C1 equal to binary 1, and C2 equals to 0, a signature analysis of combinational circuit 160 is undertaken, when a test pattern is applied to that combinational circuit 160. Note, therefore, that the register R* may either act as a shift register as part of the signature analysis function for the prior combinational circuit 160 in the course of signature analysis, or it may serve to assist in the generation of transitions to be applied to the next subsequent combinational logic circuit under test 158.

Now, if it is desired to follow the details of the logic circuit in greater depth, it may be noted that, when C1 is equal to "1", the multiplexer 166 receives information from the combinational logic circuit 160. When C1 is equal to "0" the multiplexer 166 is switched to receive information from the digital test generation circuitry 164; and the registers such as register 156 are supplied with one input to the exclusive OR circuit 162 so that the J and K inputs to the flip-flop 156 are always complementary, and so that the Q output always follows the J input. It may also be noted that when C2 is equal to a binary 1, then the NOR circuits, such as circuit 176 have 0's at their output, and the exclusive OR circuits, such as the circuit 178, follow the input from the multiplexer 166.

For the trigger mode, C1 is "0" and C2 is "1". Line 214 is "0" and therefore the output of circuit 161 is equal to the output of circuit 162. Therefore, flip-flop 156 is in the trigger mode. Since C2 is equal to "1", $E_{J2}$ will follow $D_n$, and the contents of the ring counter is applied to register R* triggering it and generating a 1-transition.

Now, for the purpose of checking the output from a combinational circuit to which all possible 1 transitions have been applied, and various of these proposed checking methods have been mentioned hereinabove, frequent mention has been made of signature analysis, and it is considered appropriate to make reference to a few background articles which disclose the nature of signature analysis in somewhat greater detail. These include an article entitled, "Hexadecimal Signatures Identify Purple Spots in Microprocessor Systems" by Gary Gordon, et al., Electronics, Mar. 3, 1977, pages 1 through 8 and "Signature Analysis: a New Digital Field Service Method," by Robert A. Frohwerk, on pages 9 through 15 of the same issue of ELECTRONICS. Essentially as shown in FIG. 14, signature analysis involves switching the mode of operation of register R* into shift register action, and implementing a feedback polynomial combinational circuit 168 extending from each of the outputs of registers 152, 154 and 156 back through the circuit 168 to the NOR circuit 176. Following test operation of the combinational circuit 160, with C1 set to 1 and C2 set to 0, for signature analysis, the entire sequence is gone through and the pattern held in registers 152, 154 and 156, and this final pattern constitutes a recognizable "signature" if all of the circuit paths in circuit 160 are valid and correct and include no delay faults. In order to check out the circuit pattern in register R*, an AND gate 180 may be provided with direct or inverting inputs from each of the three registers 152, 154 and 156 corresponding to the proper signature expected if all the paths in circuit 160 are correct. Accordingly, the output on lead 182 from AND gate 180 will be a "1" if the combinational circuit 160 has not produced any errors due to faults, and will produce a "0" if faults have produced errors which caused registers 152, 154 and 156 to end up in the wrong final state.

Figure 15:
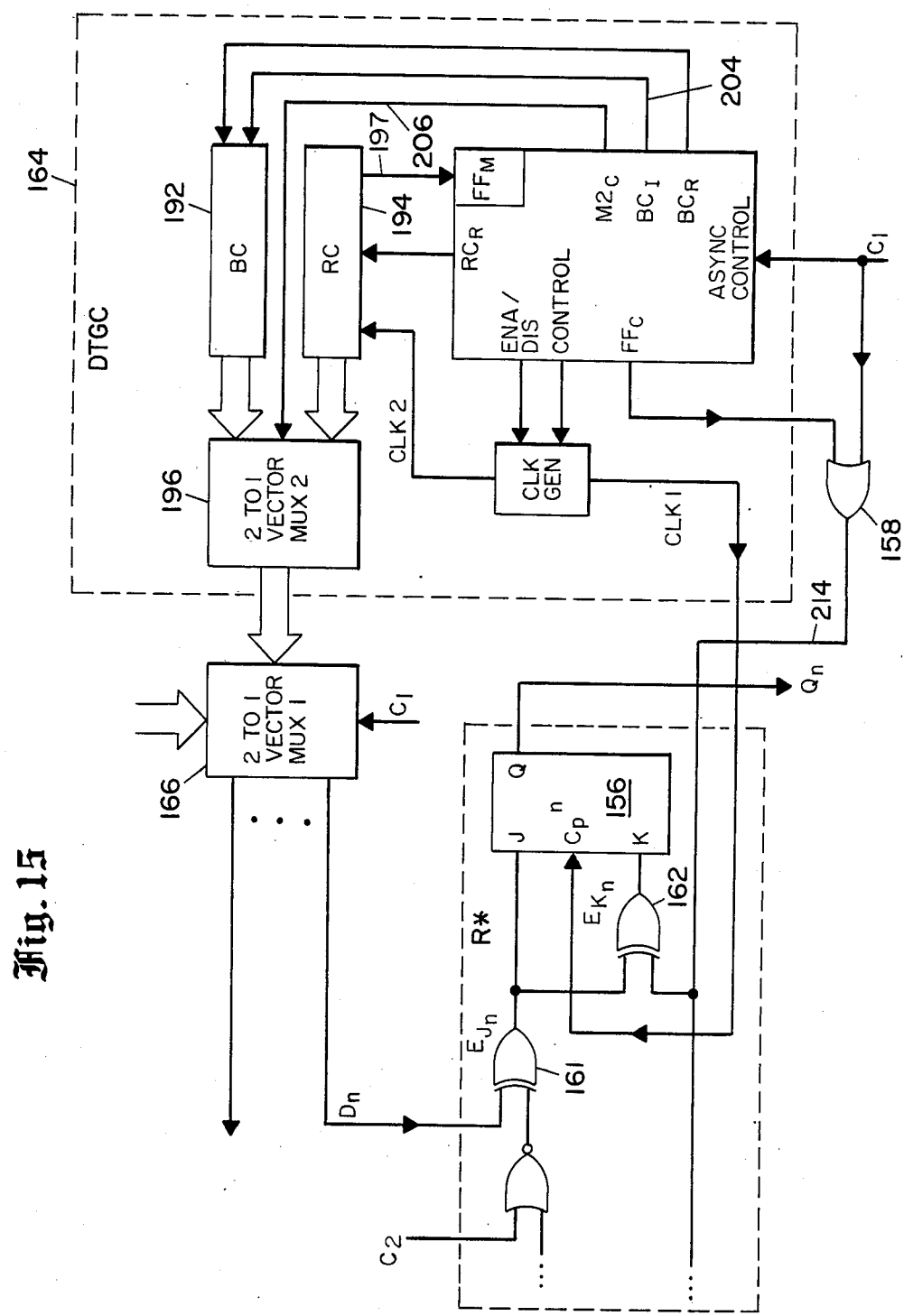
FIG. 15 is a block circuit diagram of the delay test generation control circuitry for inclusion in the circuit of FIG. 14.
Figure 1F:
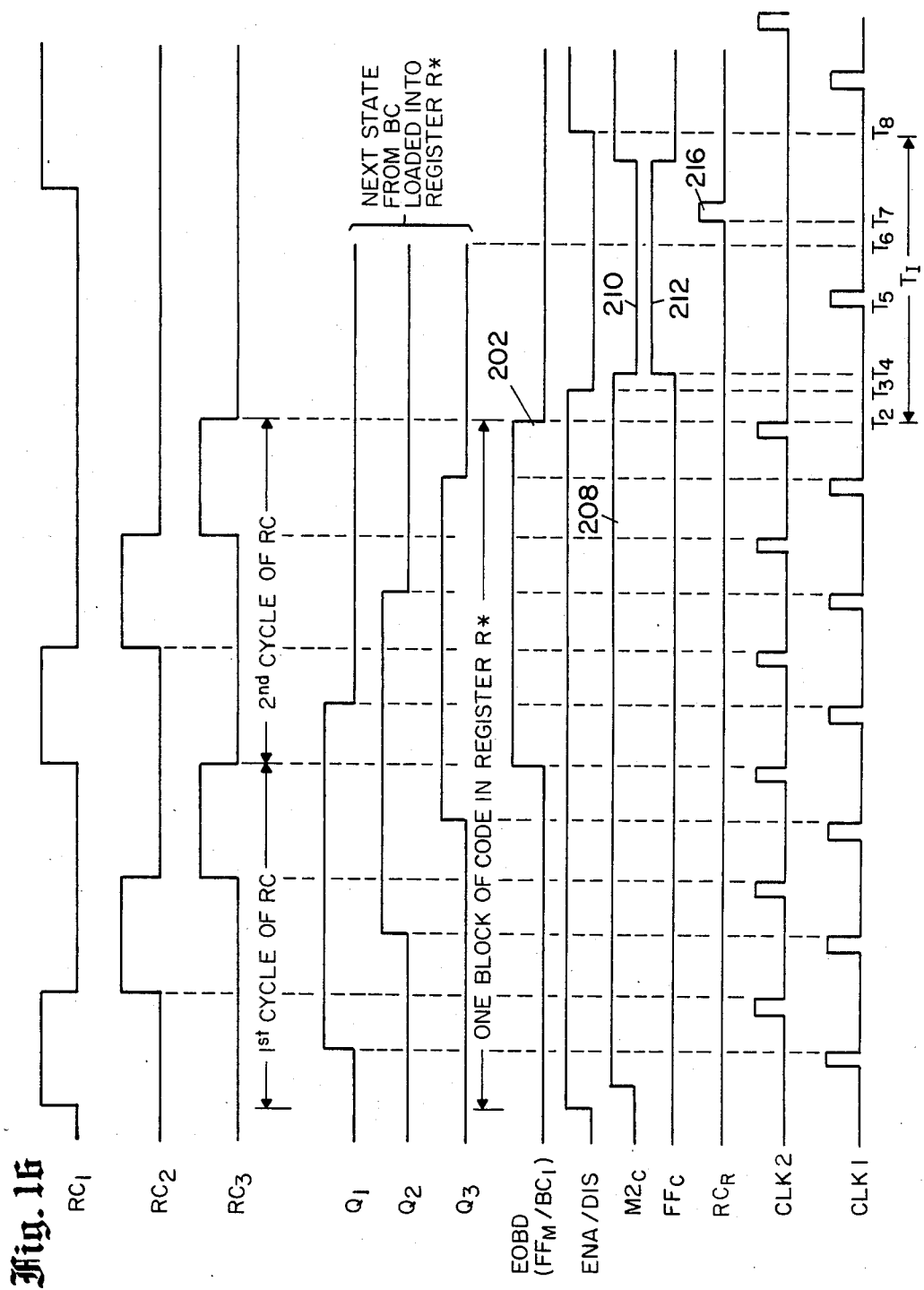

FIG. 15 is an enlarged circuit diagram of a portion of the circuit of FIG. 14, more specifically, the digital test generation circuitry 164, and its association with the last register 156 of the set of registers R*. It may be noted initially that the digital test generation circuitry 164 includes a binary counter 192 and a ring counter 194. The overall mode of operation of the circuit of FIG. 15 will now be considered. More specifically, the binary counter 192 is initially set to 0. The output from the binary counter is then coupled through both of the two multiplexers 196 and 166 and the contents of the binary counter 192 are inserted into the register R*. The multiplexer 196 is then switched to receive signals from the ring counter 194, which is applied through MUX 166 to the n stages of the register R* and successively toggles the individual registers 152, 154 and 156 which are included in the n stage register R*. After the ring counter has completed two cycles, the multiplexer 196 is switched back to receive the input from the incremented binary counter 192, and the cycle is repeated.

As shown in FIGS. 15 and 16, the delay test generation mode is initialized with $C_1=0$, $C_2=1$. Setting of $C_1=0$ generates appropriate signals (not shown in FIG. 16) which; (1) reset the binary counter 192 and the R* register to all zero state; (2) ring counter 194 initializes to state 100 . . . 0; (3) configures R* in Test mode and (4) enables MUX2 (a 2 to 1 vector multiplexer) to route signals from the ring counter to inputs of R* via MUX1. When the ring counter 194 runs through two complete cycles, register R* one block of 2n 1-transitions. After generating one block of code R* has to be reloaded with a new state from the binary counter. The end of one cycle of ring counter is identified by monitoring its MSB (Most Significant Bit), via the End of Block Detection line (EOBD) shown at reference numeral 197 in FIG. 15. A flip-flop $FF_M$ driven by this line will produce a negative edge after two complete cycles have taken place in the ring counter. This negative edge initiates an activity in the control block which:

(i) Freezes/disables the clock CLK1.
(ii) The binary counter is incremented via $BC_I$.
(iii) MUX2 is enabled via $M2_C$ to route signals from the binary counter to register R* inputs.
(iv) The register R* flip-flops are set to normal mode via signals on line $FF_C$.
(V) A delayed single clock pulse on line CLK1 is generated at which time the contents of the binary counter are transferred to the register R*, thereby initializing R* to the first state of the next block of code to be generated.

After a pre-specified delay, the ring counter resets via the line $RC_R$ to the initial state 10 . . . 0 and the control is activated in the following order to generate the next block of Gray code:

(i) The R* register is again configured into the test mode;
(ii) MUX2 routes signals from the ring counter; and
(iii) The clock CLK1 is enabled and the next block of code generation starts. The complete timing diagram indicating one initialization and one block of code generation for a 3-bit ring counter and 3-bit register R* is shown in FIG. 16. The setting to "1" of the MSB of the binary counter is used to reset and terminate the test phase, signalling the end of generation of complete sequence of delay test-patterns.

In Table I set forth hereinbelow, the successive states of the register R*, under control of the digital test generation circuitry 164 are set forth. In the top row of Table I, are the successive states of the binary counter 192, and immediately below each of these four states are the successive states produced as the ring counter 194 is cycled through twice. Following such cycling, as mentioned above, the registers R* are cleared and multiplexer 196 is shifted to receive data from the binary counter 192, and the incremented number in the binary counter 192 is stored into register R* as the starting point for the next set of transitions which appears in successive columns in Table I.

TABLE 1

STATE TABLE FOR CIRCUIT R*
OF FIGS. 14 AND 15

| Binary Counter - | 000 | 001 | 010 | 011 |
|---|---|---|---|---|
| | 100 | 101 | 110 | 111 |
| | 110 | 111 | 100 | 101 |
| | 111 | 110 | 101 | 100 |
| | 011 | 010 | 001 | 000 |
| | 001 | 000 | 011 | 010 |
| | 000 | 001 | 010 | 011 |

Now, in the diagram of FIG. 16, the top three plots show the states of the three stages of the ring counter 194, as it is cycled twice through its three stage cycle. The outputs from the three flip-flops 152, 154 and 156 making up the register R*, are shown in the next three plots designated Q1, Q2 and Q3 in FIG. 16. The next plot in FIG. 16 shows the falling edge 202 of a pulse which is applied on lead 204 to the binary counter 192 to increment it forward. It may be noted that the falling edge 202 occurs during the second of the two cycles of operation of the ring counter. The multiplexer 196 is controlled over lead 206 from output $M2_c$ and this is indicated by the plot designated $M2_c$ in FIG. 16. It may be noted that during the period of the elongated pulse 208, that the output from the ring counter 194 is supplied through the two multiplexers 196 and 166 to the register R*; while during the period between pulses, designated 210 in FIG. 16, the binary counter 192 is coupled through the two multiplexers 196 and 166, so that its output is transferred to the register R*.

The mode of operation of the individual J-K flip-flops included in the register R* is controlled by the pulse 212 which is designated $FF_C$, to indicate flip-flop control. When the pulse 212 is present, the flip-flop 156, and the other flip-flops in register R* operate to receive applied information, such as that from the binary counter 192; while in the absence of a pulse on lead 214, the individual flip-flops change state when a pulse is received at the J input.

The binary counter read pulse 216 serves to apply the output from the n registers of the binary counter 192 through the multiplexers 196 and 166 for their transfer into the n registers of the register R*. The timing of the data processing circuit is controlled by clock signals which are in slightly different phases, and which are designated CLK1 and CLK2 in FIGS. 15 and 16. The clock-2 (CLK2) pulses are employed to increment the ring counter, and the clock 1 pulses are employed to operate the flip-flops included in the R* register, with the clock 1 pulses being spaced after the clock 2 pulses so that the ring counter 194 will have settled into its new state, before signals from the ring counter are sensed and employed to determine the new state of the flip-flops 152, 154 and 156.

Figure 17:
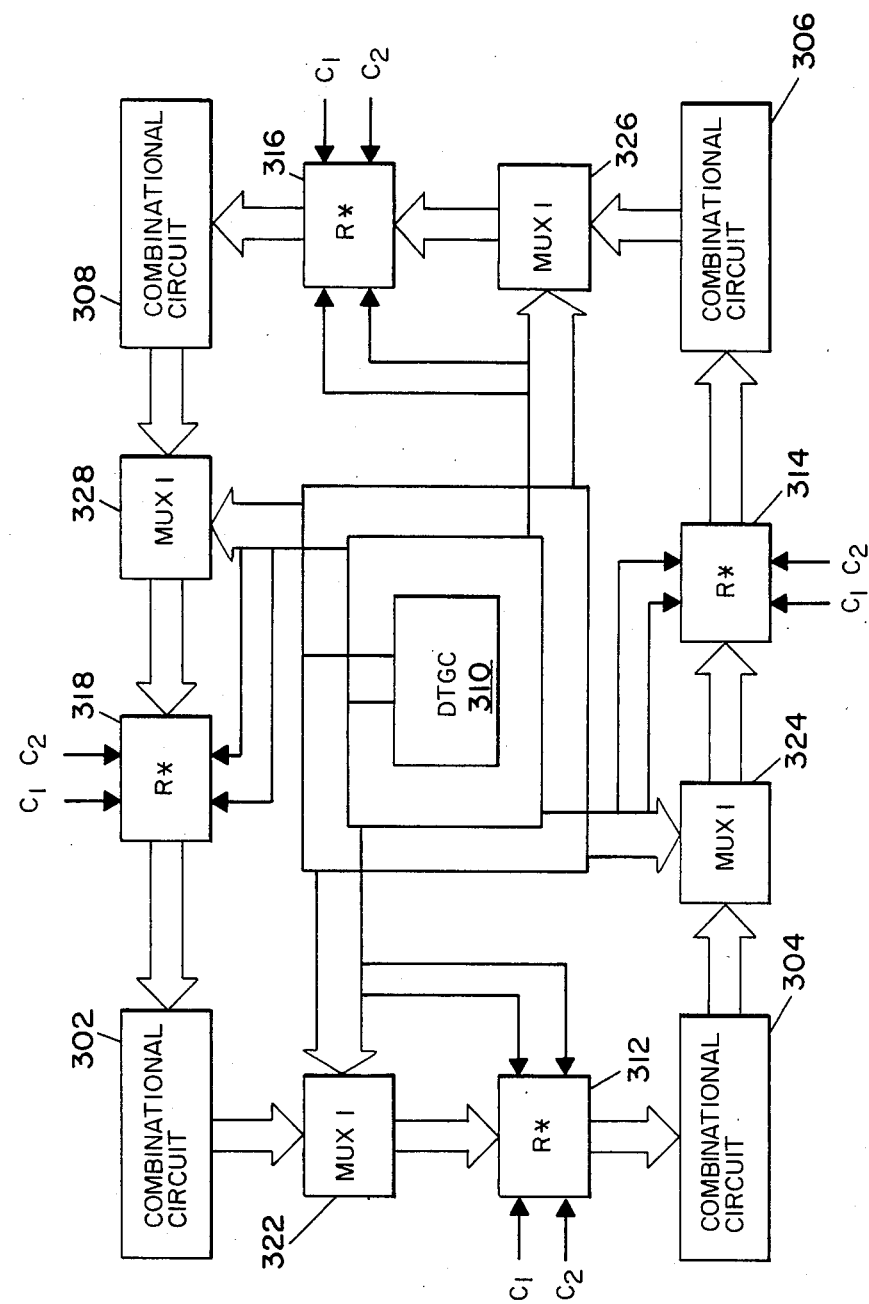
FIG. 17 is a block circuit diagram of a configuration for a common delay test pattern generator, employed in connection with the testing of several combinational logic circuits.

In the foregoing description of FIGS. 14, 15 and 16, the detailed mode of operation of the logic circuitry and the timing of the digital signals within the circuitry has been discussed in considerable detail. FIG. 17 shows how a series of four combinational circuits 302, 304, 306 and 308 may be successively tested using a single digital test generation circuit 310, which is shown centrally located in FIG. 17. In addition, between each of the combinational circuits is a register designated R*, and which carry the numbers 312, 314, 316 and 318 in FIG. 17. Also provided in FIG. 17 are a series of multiplexers 322, 324, 326 and 328 which serve to selectively couple the outputs from the digital test generation circuit 310 to the combinational circuits. In addition, the output signals from the digital test generation circuitry 310 may be employed to switch the mode of operation of the R* registers into the various modes described hereinabove. Thus, under normal operating conditions, the multiplexer circuits may connect the combinational circuits to one another so that the normal flow of digital information is accomplished. Upon entering a test mode, however, initially it is assumed that the combinational circuit 302 is under test. Under these conditions, a digital test pattern of transitions is supplied from register 318 under the control of the ring counter and the binary counter included in test circuitry 310 routed to the register 318 through the multiplexer 328. At the output of the combinational circuit 302, the register R*, bearing reference numeral 312, is connected to operate as a signature analysis circuit, and checks the validity of the signals from the combinational circuit 302 as the transitions arrive from the register 318. Following the test of circuit 302, then the other combinational circuits 304, 306 and 308 may be successively tested. Thus, with a number of circuits such as those shown in FIG. 17 being mounted on a single chip, a common digital test generation circuit 310 may be employed to test all of them.

Incidentally, when the digital test generation circuitry is mounted directed onto the same chip with a normal utilitarian logic circuit, it may be referred to as a built-in test system. Alternatively, where a complete combinational circuit may be present on an existing chip, it may be tested in accordance with the principles of the present invention by coupling it to a digital test generation circuit at its input, and to a signature analysis or other test output circuit to verify the validity of the signals which are present at the output when the series of 1-transitions is applied to the input.

The present invention could also be readily adapted to use with existing BILBO (Built-In Logic Block Observation) circuits which test for "stuck-at" faults, by minor modifications to the input BILBO registers. These modifications would be similar to those which have been included in the R* registers of FIGS. 14, 15 and 17. With this type of modification, the resultant system would test for delay faults as well as the so-called "stuck-at" faults, previously identified for test by BILBO circuitry. The concept of BILBO is discussed in the paper by B. Koneman, J. Mucha, and G. Zwiehoff entitled "Built-in Logic Block Observation Techniques," and published in the IEEE Test Conference, 1979, pages 37-41.

In connection with FIGS. 9-17, one approach for implementing 1-transition testing, which is much simpler and more economical of logic circuitry than the "brute force" approach of FIG. 8, has been shown. However, the delays, which may in some cases be introduced in some of the embodiments shown in FIGS. 9-17, although minor, may not be desirable for certain applications. In the following description of FIGS. 18 through 27, an alternative design which includes less delay is disclosed.

Figure 18:
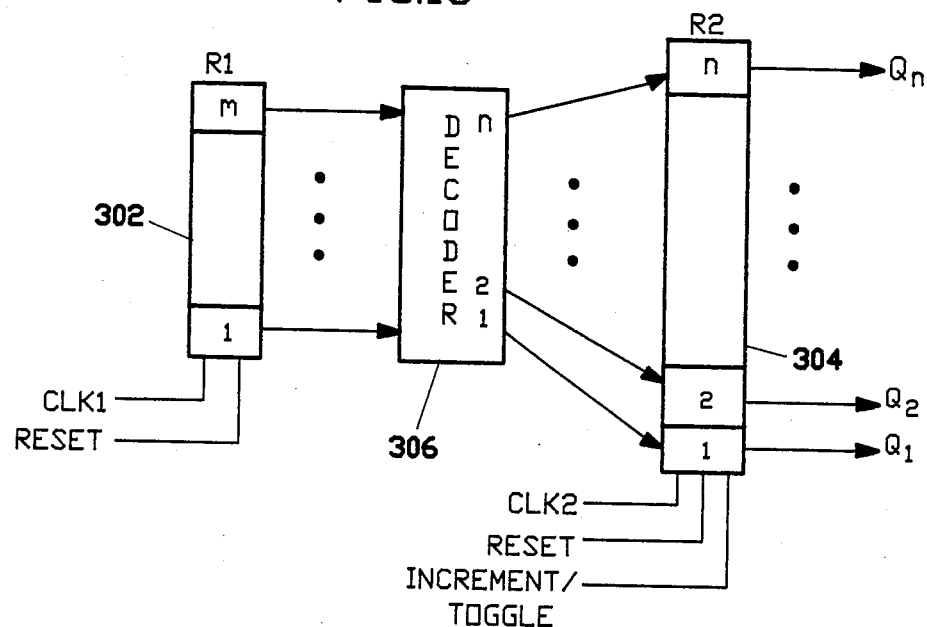
FIG. 18 shows a circuit configuration for generating all 1-transitions.

One circuit configuration using less hardware than that employed in FIG. 8 and having additional advantages is shown in FIG. 18 which includes binary counters 302 (R1) and 304 (R2) intercoupled by a decoder 306. For simplicity assume that n is a power of 2 and that m is the logarithm to the base of 2 of n. Hence if $n=2\times2\times2=2^3$ or 8, then $m=3$. R1 and R2 are binary counters. In addition, register R2 can also be made to operate in a toggle mode, that is, if the input to a flip flop in register R2 is a binary "1" when the clock pulse occurs, that flip flop will change state (toggle). The decoder operates as follows. The binary input to the decoder can be considered to be a decimal integer. For example, for $m=3$, the output code 000 corresponds to 0, 001 to 1, and 111 to 7. Then if the input to the decoder 3, then the output line of the decoder labeled $1+3=4$ is "1" and all others are "0". The outputs of the decoder 306 are the toggle inputs to register R2.

The circuit of FIG. 18 can be controlled to operate as follows. First registers R1 and R2 are initialized to 0 using the reset line. Then R2 is put into its toggle modee and R1 counts from 0 to $2^m-1$. For each value in R1, register R2 is clocked twice, once toggling a flip flop to a new value, then back to its original value. Each flip flop in R2 will be triggered twice.

This process of counting from 0 to $2^m-1$ and toggling R2 $2\times(2^m-1)$ times constitutes one cycle of operation. Register R2 is now in the same state in which it was prior to this cycle. Then R1 returns to its initial state of 0, R2 is incremented once, and a new cycle of operation repeated. This process is repeated for each of the $2^n$ initial states of register R2. This process generates more than $2^m\times2\times2^n=2n\times2^n=n\times2^{n+1}$ 1-transitions. Since there are only $n2^n$ unique 1-transitions, each 1-transition is actually generated twice. Table 2 shows the results for $n=2$ and $m=1$.

Figure 19:
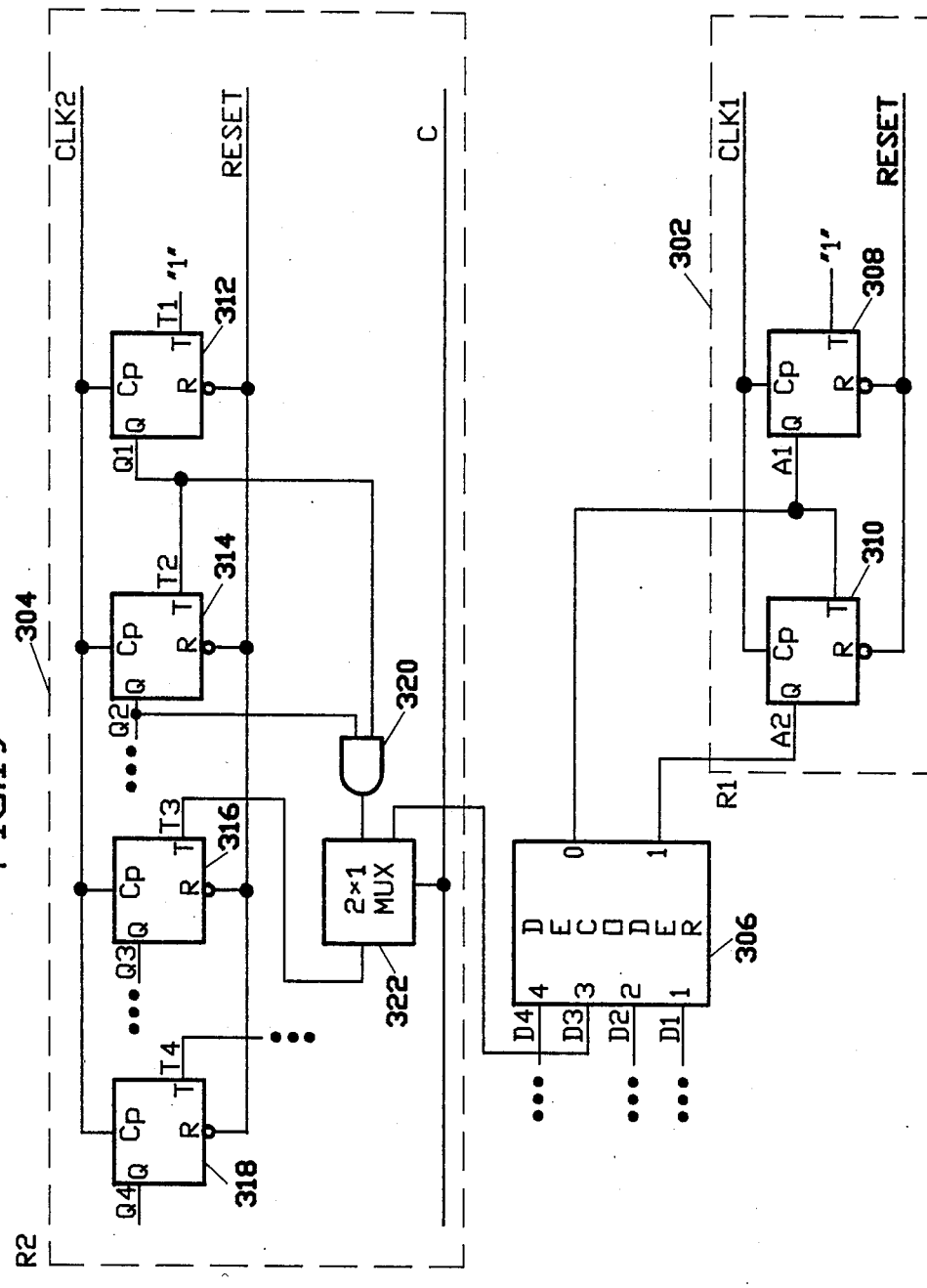
FIG. 19 is a more detailed showing of the design of one circuit of FIG. 18.

A more detailed implementation of the circuit of FIG. 18 for the case $n=4$ is shown in FIG. 19. In FIG. 19, the counter 302 (R1) includes two flip-flops 308 and 310; and the counter 304 includes four flip-flops 312, 314, 316, and 318. We have only shown the detailed logic input for flip-flop 316(Q3). Here, for simplicity of presentation only, we have used all trigger type flip-flops. A trigger flip-flop operates as follows. If its T input is "1" when a clock pulse occurs, then it will change state (toggle); if the T input is "0" then it does not change state. In Table 3 set forth below, we show the sequence of states for a normal 4-bit counter when counting from to 0 to 15. Note that the I-th flip-flop changes state whenever, during the previous clock period, the state of all less significant digit flip-flops 1,2,..., (I−1) are "1". For example, Q3 changes state when $Q1=Q2=1$. Hence the condition for changing state for Q3 is given by $T3=(Q1$ AND $Q2)$. This mode of operation is accomplished by the AND gate 320 and the multiplexer or MUX 322. In FIG. 19, if $C=1$ then the register R2 acts as a normal binary counter. If $C=0$ then the output of the decoder 306 drives the input to the flip-flops in R2. Hence, if $A2=1$ and $A1=0$, then the binary sequence 10 corresponds to decimal 2, and $T3=D3=1$ and hence Q3 will change state when clocked. Note that once line 14 in Table 2 is generated, all 1-transitions have been generated. This fact can be used to terminate the length of the test process sooner than described previously.

TABLE 2

| Test sequence produced by circuit of FIG. 18. | | | | |
|---|---|---|---|---|
| LINE # | R1 | R2 Q2 | Q1 | COMMENTS |
| 1 | 0 | 0 | 0 | initial state, toggle Q1 |
| 2 | 0 | 0 | 1 | toggle Q1 |
| 3 | 1 | 0 | 0 | toggle Q2 |
| 4 | 1 | 1 | 0 | toggle Q2 |
| 5 | 0 | 0 | 0 | increment R2 |
| 6 | 0 | 0 | 1 | new state of R2, toggle Q1 |
| 7 | 0 | 0 | 0 | toggle Q1 |
| 8 | 1 | 0 | 1 | toggle Q2 |
| 9 | 1 | 1 | 1 | toggle Q2 |
| 10 | 0 | 0 | 1 | increment R2 |
| 11 | 0 | 1 | 0 | |
| 12 | 0 | 1 | 1 | etc. |
| 13 | 1 | 1 | 0 | |
| 14 | 1 | 0 | 0 | . |
| 15 | 0 | 1 | 0 | increment R2 |
| 16 | 0 | 1 | 1 | |
| 17 | 0 | 1 | 0 | |
| 18 | 1 | 1 | 1 | |
| 19 | 1 | 0 | 1 | |
| 20 | 0 | 1 | 1 | ←done |

TABLE 3

Normal sequence of states for a 4 bit binary counter.

COUNT SEQUENCE

| Q4 | Q3 | Q2 | Q1 |
|----|----|----|----|
| 0 | 0 | 0 | 0 |
| 0 | 0 | 0 | 1 |
| 0 | 0 | 1 | 0 |
| 0 | 0 | 1 | 1 |
| 0 | 1 | 0 | 0 |
| 0 | 1 | 0 | 1 |
| 0 | 1 | 1 | 0 |
| 0 | 1 | 1 | 1 |
| 1 | 0 | 0 | 0 |
| 1 | 0 | 0 | 1 |
| 1 | 0 | 1 | 0 |
| 1 | 0 | 1 | 1 |
| 1 | 1 | 0 | 0 |
| 1 | 1 | 0 | 1 |
| 1 | 1 | 1 | 0 |
| 1 | 1 | 1 | 1 |
| 0 | 0 | 0 | 0 |

The 1-transitions can also be generated in a different way. Rather than clocking R2 twice for each state in R1, R2 can be clocked once for each state, and the counter R1 can go through two full cycles of counting before R2 is incremented. The resulting sequence so generated again produces more than $n \times 2^{n+1}$ 1-transitions, and again each 1-transition is generated at least twice. Table 4 shows the resulting sequence for $n=2$ and $m=1$.

Figure 20:
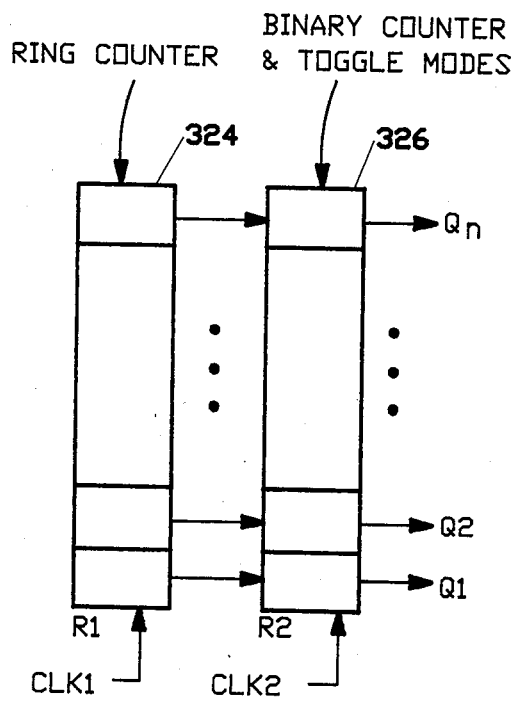
FIG. 20 shows a circuit including a ring counter and a binary counter for generating 1-transitions.

Rather than use a counter 302(R1) and decoder 306 as shown in FIGS. 18 and 19, a ring counter can be used. A ring counter is a register containing a single "1" in one of its flip-flops, and for each clock pulse, the "1" is shifted one position, as described hereinabove. FIG. 20 indicates the organization of this new design including ring counter 324(R1) and binary counter 326(R2). This design can operate in either of the two modes described previously.

Mode 1: The counter R2 counts through each of its states. For each of its $2^n$ states the ring counter goes through one cycle of n shifts. For each state of the ring counter, a flip flop in R2 is toggled twice. This produces the same results as shown in Table 2 for $n=2$, except that R1 is a 2 bit register.

Mode 2: The counter R2 counts through each of its states. For each of its $2^n$ states the ring counter goes through two cycles of n shifts: For each state of the ring counter a flip flop in R2 is toggled just once. This produces the operation shown in Table 4 for $n=2$, except that R1 is a two bit register. Note that after processing two cycles through the ring counter, each flip flop in R2 is toggled twice, hence the state of the counter is the same as before the two cycles were executed. Referring to Table 4, note that the states of register R2 corresponding to the following pairs of line numbers are identical:

1 and 5: (5=1+4)
6 and 10: (10=6+4)
11 and 15: (15=11+4)
16 and 20: (20=16+4)

Hence by incrementing R2, this register R2 actually counts through the sequence 0,1,2,3, . . . There are $n2^n$ unique 1-transitions. For $n=2$, there are $2 \times 2^2 = 8$ unique 1-transitions. Below we list the 1-transitions generated in Table 4 during the "toggle" mode only.

The symbol t stands for a 0 to 1 transition, and t' for a 1 to 0 transition.

TABLE 4

Test sequence generated by cycling through R1 sequence twice for each initial state in R2.

| LINE # | R1 | R2 Q2 | R2 Q1 | COMMENTS |
|---|---|---|---|---|
| 1 | 0 | 0 | 0 | 1st cycle for R1 |
| 2 | 1 | 0 | 1 | |
| 3 | 0 | 1 | 1 | 2nd cycle for R1 |
| 4 | 1 | 1 | 0 | |
| 5 | 0 | 0 | 0 | ←increment R2 |
| 6 | 0 | 0 | 1 | 1st cycle for R1 |
| 7 | 1 | 0 | 0 | |
| 8 | 0 | 1 | 0 | 2nd cycle for R1 |
| 9 | 1 | 1 | 1 | |
| 10 | 0 | 0 | 1 | ←increment R2 |
| 11 | 0 | 1 | 0 | |
| 12 | 1 | 1 | 1 | etc. |
| 13 | 0 | 0 | 1 | |
| 14 | 1 | 0 | 0 | |
| 15 | 0 | 1 | 0 | ←increment R2 |
| 16 | 0 | 1 | 1 | |
| 17 | 1 | 1 | 0 | etc. |
| 18 | 0 | 0 | 0 | |
| 19 | 1 | 0 | 1 | |
| 20 | 0 | 1 | 1 | |

TABLE 5

| All 1-transitions | | Line #'s in Table 4 when transition occurs | |
|---|---|---|---|
| Q2 | Q1 | | |
| 1 | 0 | t | 1,2 | 18,19 |
| 2 | 0 | t' | 6,7 | 13,14 |
| 3 | 1 | t | 8,9 | 11,12 |
| 4 | 1 | t' | 3,4 | 17,18 |
| 5 | t | 0 | 7,8 | 14,15 |
| 6 | t' | 0 | 4,5 | 17,18 |
| 7 | t | 1 | 2,3 | 19,20 |
| 8 | t' | 1 | 9,10 | 12,13 |

For example, both steps 1 to 2, and 18 to 19 in Table 4 produce the 1-transition (0 t). In fact, every 1-transition has been generated twice. Also, it can be seen that steps 1 through 10 generate all the 1-transitions, and 11 through 20 generate their duplicates. Hence only half of the test sequence need be generated. This observation can be shown to be true in general, and not just for $n=2$. To generate half the test, all that is required is to stop the process after R2 is incremented and the most significant bit of R2 is a 1. Referring to Table 4, this occurs at line number 11.

We have shown theoretically that there exist a set of $2^{n-1}$ initial states for register R2 such that by toggling the flip flops in this register for each state using two passes of a ring counter, or an equivalent implementation, all 1-transitions can be generated. A counter is just one simple way of generating these $2^{n-1}$ initial states.

Another alternative would be the same as mode 2 as discussed above, except that when a 1 in the most significant bit of R2 is generated after incrementing R2, the process of generating 1-transitions terminates. The number of test patterns generated is $2^{n-1} \times 2n + 2^{n-1} + 1 = n2^n + 2^{n-1} + 1$ which is very close to minimal possible value of $n2^n + 1$, and significantly less than the previous techniques requiring of the order of $n2^{n+1}$ test vectors, i.e. nearly twice as many.

Concerning another aspect of the test circuitry, assume that for each position of the "1" in R1, rather than clock R2 once while in the toggle mode, we toggle it three times. The result is not only a 1-transition on some output line, say $Q_i$, of the form 0 to 1 or 1 to 0, but actually two pulses of the form 0 to 1 to 0 to 1 or 1 to 0 to 1 to 0. Later we will show how these pulses can be used to test a circuit.

Figure 21:
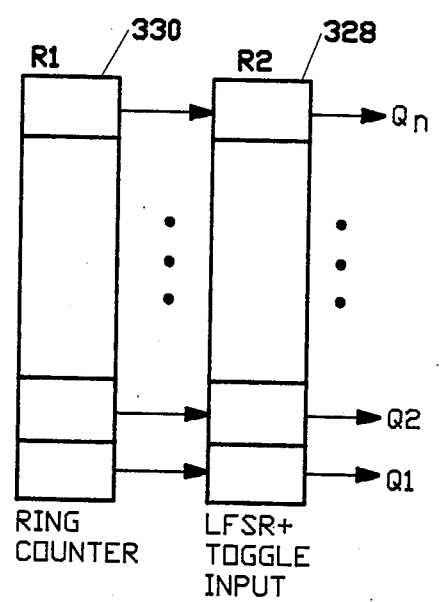
FIG. 21 depicts a 1-transition generator using a linear feedback shift register and a ring counter.

FIG. 21 indicates a slightly different form of a register configuration for generating 1-transitions. Here the counting mode of R2 has been replaced by a pseudo random number generation mode produced by using a linear feedback shift network (LFSR) used in combination with a ring counter 330 (R1). If all $2^{n-1}$ vectors are produced by the pseudo random number generator, then all 1-transitions will be generated. To reduce test time, fewer than $2^{n-1}$ states can be generated by the pseudo random number generator, in which case not all 1-transitions may be generated. Again, after each state is generated by the pseudo random number generator two cycles through the ring counter are processed.

The number of uniques states produced by the LFSR is determined by the feedback polynomial associated with the feedback logic. Polynomials exist which will generate anywhere from a few to all $2^{n-1}$ states. The all "0" state is not normally generated. Details on the design of such registers can be found in the book Shift Register Sequences, by S. W. Golomb, published by Aegean Park Press, Laguna Hills, Calif. 1982.

When 1-transitions are to be generated on a chip itself, it is sometimes too expensive in terms of area overhead, to modify many registers to be either counters or linear feedback shift registers. For such a situation the configuration shown in FIG. 22 can be used. Here a single linear feedback shift register 332 is used to produce a pseudo random sequence of 0's and 1's at node G. The data can be sent to several registers, such as register 334 (R2(1)) which can act as both a shift register or in the toggle mode. FIG. 22 also includes additional shift registers 336(R2(2)) and 338(R2(m)) as well as the ring counter 340 (R1). The 1-transitions are generated as follows.

Step 1: Generate a new output from the LFSR and shift register R2(1) to the right one bit position.
Step 2: Go through two complete cycles of the ring counter R1 while R2(1) is in the toggle mode.
Step 3: Repeat steps 1 and 2 until either all 1-transitions are generated or until a satisfactory number of 1-transitions have been generated. Note that there are techniques for generating a pseudo random sequence at the output G from circuit 332, and shifting this data into R2(1) so that all $2^n$ states in R2(1) are produced. For this case all 1-transitions will clearly be generated. There are also techniques for generating this data so that for every subset or for selected subsets of w bits in R2(1), where w is equal to or less than n, all $2^w$ combinations of states in these w bit will be generated. Again, for these w bits subsets, all 1-transitions will be generated using the proposed design.

It can be seen that there are numerous ways for producing 1-transitions. We will denote a generic 1-transition generator by the block symbol 542 including the legend "1-TG" as shown in FIG. 23.

Figure 24:
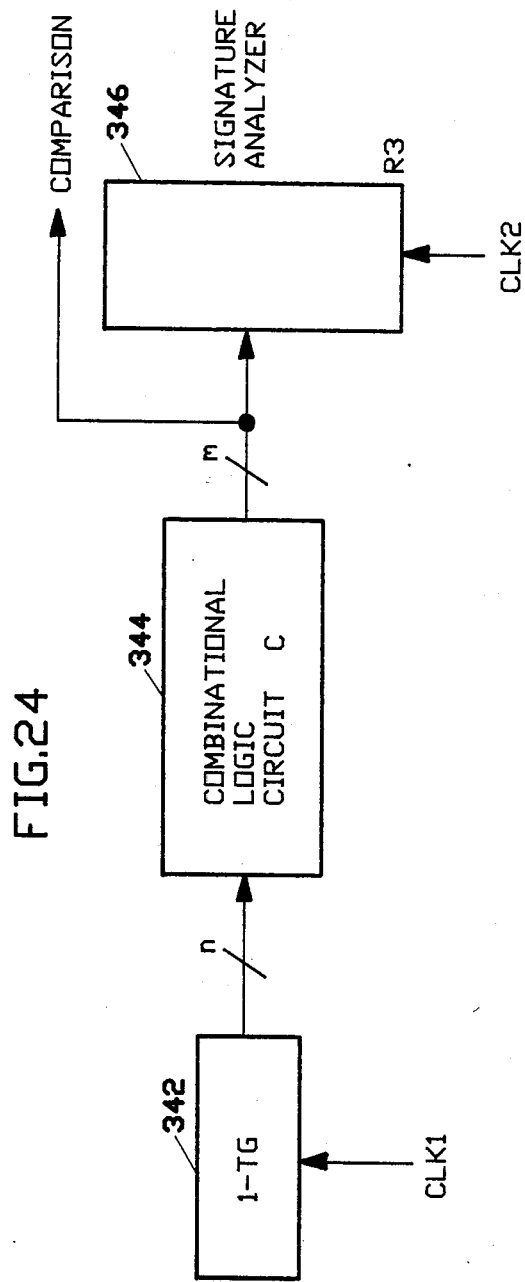
FIG. 24 is a generalized test circuit arrangement illustrating the principles of the invention.

To test a combinational logic circuit 344 designated "C" for delay faults as well as for other faults, such as "stuck-at" faults and technology related faults such as CMOS open faults, a configuration shown in FIG. 24 can be used. In FIG. 24, the 1-transitions are applied to the input to circuit 344 (C). The output can be processed either by direct comparison with the known correct results, or processed through a signature analyzer 346. After all 1-transitions have been generated, the final signature can be used to detect errors. Clocks CLK1 and CLK2 normally operate at the same clock rate. By shifting or skewing the phase between CLK1 and CLK2, the minimum delay at which C can operate can be determined.

For example, assume all flip flops trigger on the rising edge of their clock, and that 1-TG is clocked at time t1 and then the signature analyzer R3 is clocked at time t2, where t2=t1+dt. Then for large values of dt, delay faults w:11 not cause errors and the signature will remain correct. As dt gets smaller, delay faults will be detected if they exist. If dt is too small, even normal signal propagation will create errors. Hence this is truly a sensitive test configuration for detecting signal propagation properties of a circuit. Since the schemes we have describe for generating all 1-transitions also generate all $2^n$ input vectors, any permanent fault which changes the function defined by C in circuit 344 will produce an error on the output of circuit 344. Hence, for example, all detectable single and multiple "stuck-at" faults are detected by this test configuration when doing comparison type response analysis.

Figure 25:
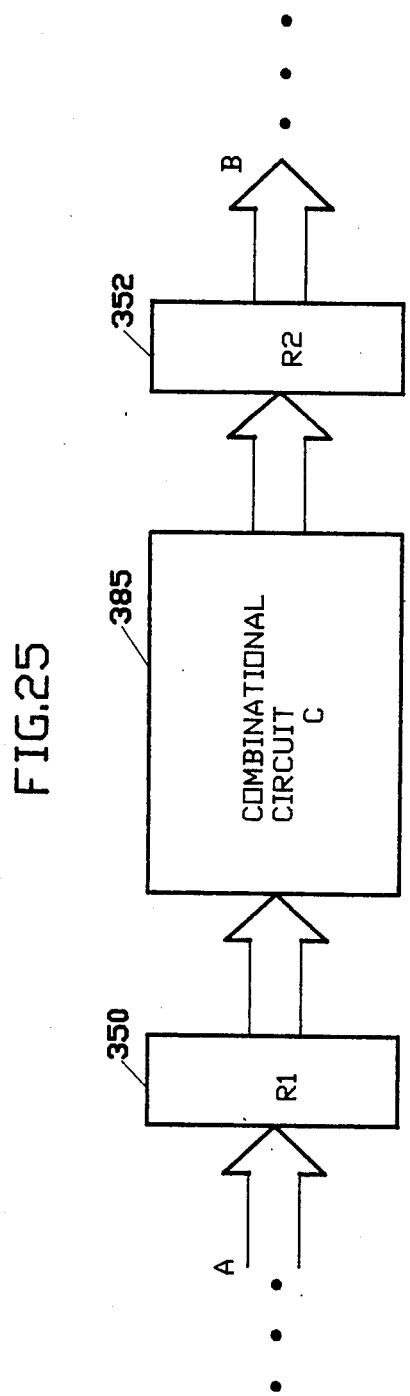
FIG. 25 shows a combinational logic circuit in a very large scale integrated (VLSI) circuit.

The configuration shown in FIG. 24 is most suitable for external testing of a circuit, i.e. where the 1-transition generator 1-TG is not on the chip itself. For built-in testing, where the 1-transition generator is part of the integrated circuit, another configuration can be used. FIG. 25 indicates the general form of a combinational circuit 385, also designated by the letter C within an integrated circuit. It has an input register 350(R1) and an output register 352(R2).

Figure 26:
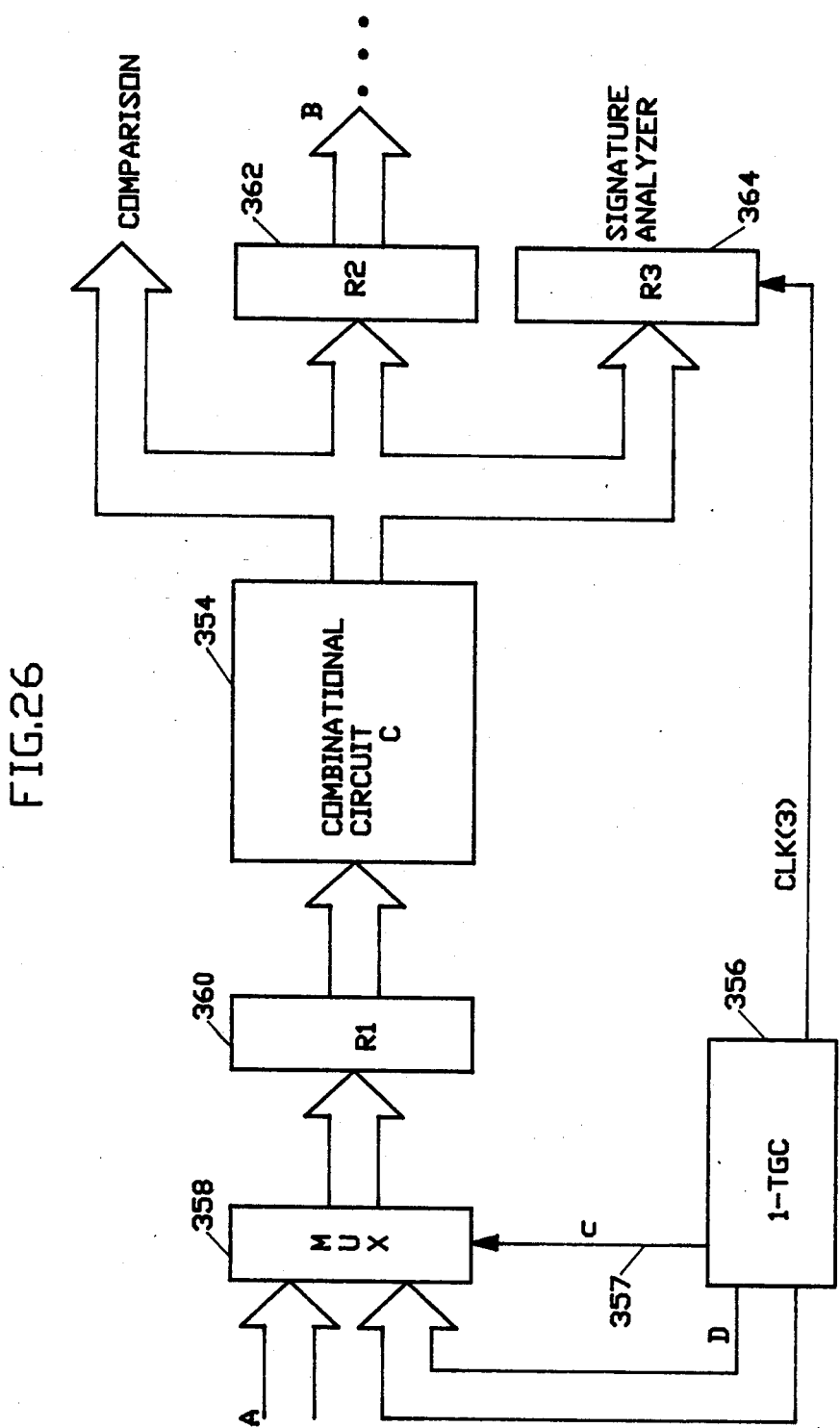
FIGS. 26 and 27 show a circuit illustrating the application of the present invention to a VLSI circuit, with built-in test arrangements.

In FIG. 26 we show how this circuit of FIG. 25 can be modified so as to test the circuit 354 (C) using 1-transitions. The circuit 356 labeled 1-TGC (for 1-transition test generator and controller) generates 1-transition test patterns. The signal on the control output lead 357 from circuit 356 is designated by the lower case letter "c". During the normal mode of operation, data passes through the multiplexer 358 or MUX(c=1) from input A and is latched into register 360 (R1). On the next clock, the response from circuit 354(C) is latched into register 362(R2). During testing (c=0), data is latched into register R1 from the 1-transition test generator and control circuit 356. The response again is latched into R2. In addition, the response can be processed via signature analysis circuit 364 or by direct comparison with the known correct response. Circuit 364 (R3) can be clocked via the normal master clock or via a special clock generated by 1-TGC having a different phase than the normal clock.

This configuration has a minimal impact on the normal delay in the circuit, namely that introduced by the multiplexer 358. Note that if many different combinational circuits are to be tested, they can share, if desired, the same 1-TGC circuit 356 and signature analyzer 364.

Figure 27:
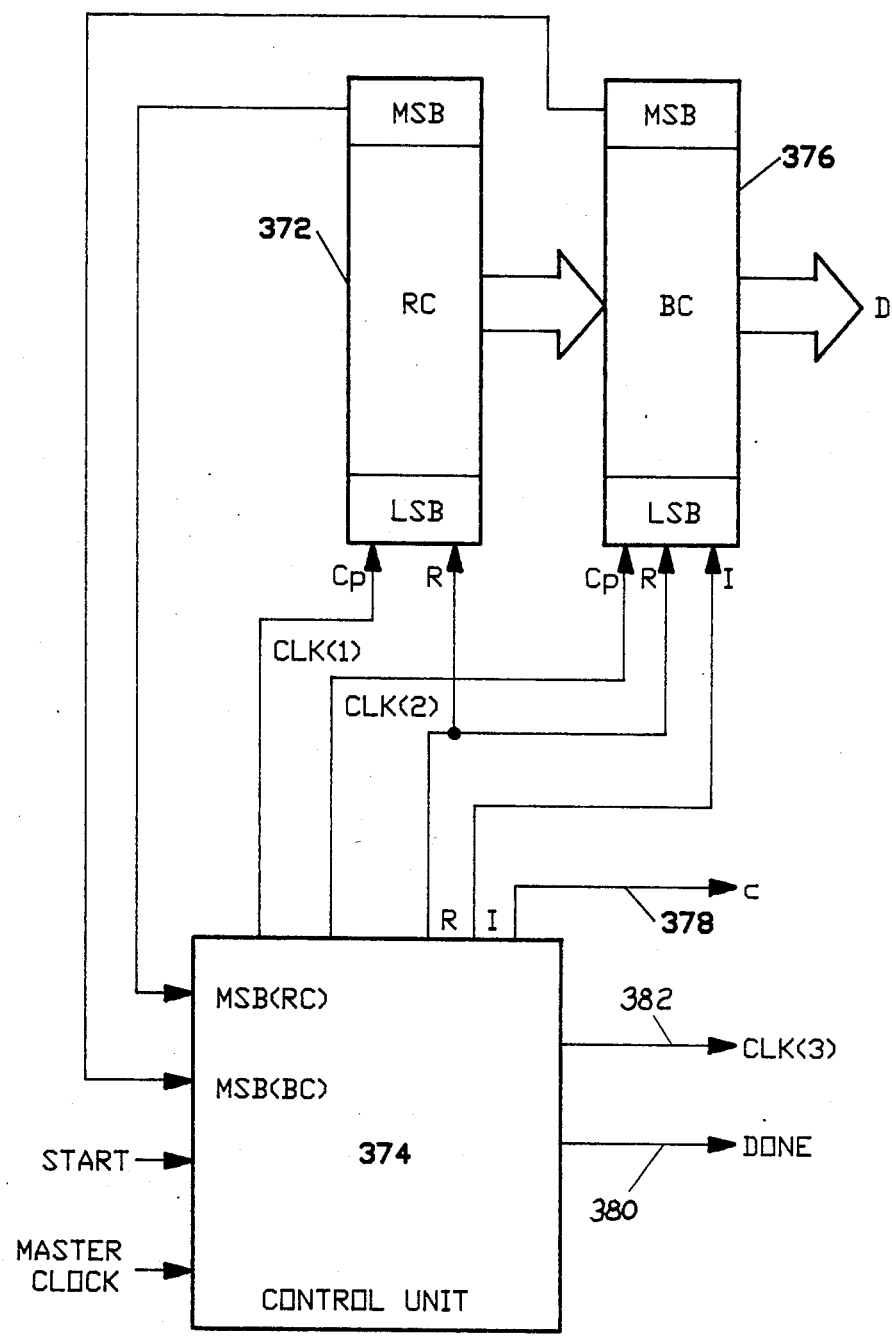

In FIG. 27 more details of the contents of the 1-TGC circuit are shown. The ring counter 372 (RC) can be set to its initial state, namely a 1 in the least significant bit (LSB), by a pulse on the reset input R from control unit 374. Each time a pulse occurs on CLK(1), the bit in the ring counter 372 is shifted one bit position. Each time a 1 occurs in the most significant bit (MSB) of the ring counter 372, a cycle has occurred. Hence after the control unit 274 has received two "1" inputs from the most significant bit (MSB) of the ring counter 372 (RC) both cycles of the ring counter have completed. The binary counter 376 (BC) has several modes of operation. A pulse on the reset line R resets the state to all 0's. If control input I=1 when a clock pulse occurs, then the BC increments by one; if I=0 when a clock pulse occurs, then the binary counter 376 is in the toggle mode and the flip flop corresponding to the position of the single "1" at the input to the binary counter to 376 from ring counter 372 changes state (toggles). After an increment process, if the most significant bit (MSB) of the binary counter 376 is a "1" then the process of generating all of the 1-transitions has completed.

The control unit 374 is a simple finite state circuit which controls the test hardware. Once a start pulse is received on the START line, it sets the "c" line 378 to a "0" to control the multiplexer 358 (FIG. 26), resets the binary and ring counters, and issues the pulse on CLK(1) and CLK(2), and controls the values of I. After each 1-transition is generated, a delayed clock pulse is generated on line CLK(3) FIG. 26, which can be used if desired to clock either a comparison circuit or the signature analyzer 364. When all 1-transitions have been generated, a pulse is generated on the line 380 designated "DONE".

As noted above, the circuitry as developed in FIGS. 25 through 27 introduces minimal delay in the system logic, as the only additional circuit is the single multiplexer 358. Accordingly the circuit is an excellent candidate for building into circuit chips of the very large scale Integration (VLSI) type.

In conclusion, it is to be understood that the foregoing description and drawings relate to illustrative embodiments of the invention. Various alternatives and changes may be made without departing from the spirit and scope of the invention. Thus, by way of example and not of limitation, a set of all possible 1-transitions may be generated through the use of a binary counter which would successively apply all binary counts in a conventional counting sequence to registers such as the R* registers of FIG. 14; and then each flip-flop would be toggled from its present state to its opposite output state and then back to its original state. In this way, all 1-transitions would be applied to the combinational logic circuit under test which would be connected to the R* register. It is noted in passing that this last-mentioned alternative would require $2n2^n$ transitions which would be close to twice the 1-transitions which might be needed in the most economical arrangement; however, in order to cover all possible multiple transitions, the number of transitions would go up geometrically, to such an astronomically large figure that it would be impractical, as well as being unnecessary. It is also noted, relative to alternatives and variations, that the type of logic circuit used to implement the mode of operation of the input and output registers could be accomplished by other types of switching and logic circuits in place of the particular multiplexers and arrangements of logic gates which have been disclosed herein. Of course, although some implementations have been shown using three stage registers or counters, many more stages would normally be present. Accordingly, the present invention is not limited to the precise circuitry as shown hereinabove.

What is claimed is:

1. A test system for testing combinational electronic logic circuits in which the electronic logic circuit to be tested can have a plurality of inputs and outputs,
    means for coupling said combinational logic circuit to a test input circuit having at least as many inputs as the combinational logic circuit,
    a test circuit pattern generation means for applying patterns to said combinational logic circuit through said coupling means, said test circuit including means for generating all possible 1-transitions between binary input combinations which differ from one-another by only one bit transition, and which include not significantly more than $2n2^n+1$ transitions, where n is the number of binary inputs to the combinational circuit; and
    means for checking the correctness of the output of the combinational circuit during a predetermined time window following each transition.

2. A test system as defined in claim 1 wherein said test circuit pattern generation means includes a ring counter.

3. A test system as defined in claim 1 wherein said test pattern generator provides all Gray code transitions.

4. A test system as defined in claim 1 wherein said combinational logic circuit has a plurality of inputs and outputs, and said test pattern generation means includes a set of registers coupled to the inputs of said combinational logic circuit, a binary counter having an output means for periodically entering the output from said binary counter into said registers, a ring counter having an output, and means for changing the state of individual stages of said set of registers in accordance with the output from said ring counter during intervals between the periodic entry from the binary counter into said registers, and means for incrementing said binary counter between successive entries from the binary counter into said registers.

5. A test system as defined in claim 1 including means for setting the state of the inputs to said combinational logic circuit to all possible input states, and means for shifting from each input state to other input states, said state and states having a Hamming distance of one.

6. A test system as defined in claim 1 wherein said combinational logic circuit has a plurality of inputs and outputs, and further including an input switching circuit for switching the inputs to said combinational logic circuit between the normal data processing operation of said logic circuit and said test circuit.

7. A test system as defined in claim 1 wherein said combinational logic circuit has a plurality of inputs and outputs, including a first register means at the inputs to said logic circuit, and a second register means at the outputs of said logic circuit; and means for selectively using said first register means as part of the test circuit pattern generation means, and means for selectively using the second register means as part of the checking circuit means.

8. A test system as defined in claim 1 wherein said checking means includes a signature analyzer.

9. A test system as defined in claim 1 including a plurality of logic circuits to be tested, register means at the inputs and outputs thereof, and common test circuit means for selectively testing each of said logic circuits.

10. A test system as defined in claim 1 wherein said test circuit means generates said 1-transitions without including significantly more than $n2^n+1$ transitions.

11. A test system as defined in claim 1 wherein said test circuit means includes a binary counter having a plurality of stages, a ring counter, and means for changing the state of individual stages of said binary counter in accordance with the state of said ring counter.

12. A method for the testing for faults including delay faults in electronic combinational logic circuits having a plurality of inputs and a plurality of outputs, comprising the steps of:

applying a series of all possible 1-transitions to the inputs of a combinational logic circuit, with the transitions being applied at predetermined times; and checking validity of the outputs from said combinational logic circuit at short time intervals after said predetermined times.

13. A method as defined in claim 12 wherein the applying of transitions is limited to a number of transitions not significantly greater than $2n2^n$, where n is the number of inputs to the electronic circuit.

14. A method as defined in claim 12 wherein the applying of transitions is limited to a number of transitions not significantly greater than $n2^n+1$, where n is the number of inputs to the electronic circuit.

15. A test system for testing combinational electronic logic circuits in which the electronic logic circuit to be tested has a plurality of inputs and a plurality of outputs;
   a normal data processing input coupled said inputs to said logic circuit;
   means for switching from the normal data processing input to said combinational logic circuit to a test input circuit having at least as many inputs as the combinational logic circuit;
   a test circuit pattern generation means for coupling to said switching means, said test circuit including means for generating all possible transitions between binary input combinations which differ from one-another by only one bit, and which include not significantly more than $2n2^n$ transitions, where n is the number of binary inputs to the combinational circuit; and
   means for checking the correctness of the outputs of the combinational circuit during a predetermined time window following each transition.

16. A test system as defined in claim 15 wherein said test circuit pattern generation means includes a ring counter.

17. A test system as defined in claim 15 wherein said combinational logic circuit has a plurality of inputs and outputs, and said test pattern generation means includes a set of registers coupled to the inputs of said combinational logic circuit, a binary counter having an output, means for periodically entering the output from said binary counter into said registers, a ring counter, having an output, and means for changing the state of individual stages of said set of registers in accordance with the output from said ring counter during intervals between the periodic entry from the binary counter into said registers, and means for incrementing said binary counter between successive entries from the binary counter into said registers.

18. A test system as defined in claim 15 including a plurality of logic circuits to be tested, register means at the inputs and outputs thereof, and common test circuit means for selectively testing each of said logic circuits.

19. A test system as defined in claim 15 wherein said test circuit means includes a binary counter having a plurality of stages, a ring counter, and means for changing the state of individual stages of said binary counter in accordance with the state of said ring counter.

20. A test system for testing combinational electronic logic circuits in which the electronic logic circuit to be tested has a plurality of inputs and a plurality of outputs:
   means for coupling said combinational logic circuit to a test input circuit having at least as many inputs as the combinational logic circuit,
   a test circuit pattern generation means for applying test patterns to said logic circuit through said coupling means, said test circuit including means for generating all possible transitions between binary input combinations which differ from one-another by only one bit transition, and which include not significantly more than $2n2^n+1$ transitions, where n is the number of binary inputs to the combinational circuit;
   said test system including a set of registers coupled to the inputs of said combinational logic circuit, a binary counter, a ring counter having an output, and means for changing the state of individual stages of said set of registers in accordance with the output from said ring counter and said binary counter;
   means for checking the correctness of the output of the combinational circuit during a predetermined time window following each transition.

21. A test system as defined in claim 17 wherein said system includes a normal data processing input to said logic circuit, and further including an input switching circuit for switching the inputs to said combinational logic circuit between the normal data processing input to said logic circuit and said test circuit.

22. A test system as defined in claim 20 including a first register means at the input to said logic circuit, and a second register means at the output of said logic circuit; and means for selectively using said first register means as part of the test circuit pattern generation means, and means for selectively using the second register means as part of the checking circuit means.

23. A test system as defined in claim 17 including a plurality of logic circuits to be tested, register means at the inputs and outputs thereof, and common test circuit means for selectively testing each of said logic circuits.

24. A test system for testing combinational electronic logic circuits in which the electronic logic circuit to be tested has a plurality of inputs and outputs,
   means for coupling said combinational logic circuit to a test input circuit having at least as many inputs as the combinational logic circuit,
   a test circuit pattern generation means for applying test patterns to said logic circuit through said coupling means, said test circuit means including means for generating only transitions between binary input combinations which differ from one-another by only one bit transition;
   said test system including a set of registers coupled to the input of said combinational logic circuit, a ring counter having an output, and means for changing the state of individual stages of said set of registers in accordance with the output from said ring counter; and
   means for checking the correctness of the outputs of the combinational circuit during a predetermined time window following each transition, said time window corresponding to a cycle of the logic circuit under test.

* * * * *